(12) United States Patent
Chen

(10) Patent No.: US 7,430,701 B2
(45) Date of Patent: Sep. 30, 2008

(54) METHODS AND SYSTEMS FOR GENERATING ERROR CORRECTION CODES

(75) Inventor: Hong-Ching Chen, Kao-Hsiung Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 456 days.

(21) Appl. No.: 11/160,263

(22) Filed: Jun. 16, 2005

(65) Prior Publication Data

US 2007/0011590 A1    Jan. 11, 2007

(51) Int. Cl.
*H03M 13/00* (2006.01)
*G11C 29/00* (2006.01)

(52) U.S. Cl. .................. 714/763; 714/755; 714/756

(58) Field of Classification Search .............. 71/755, 71/756, 763; 714/755, 756, 763
See application file for complete search history.

(56) References Cited

U.S. PATENT DOCUMENTS

| | | | | |
|---|---|---|---|---|
| 3,678,469 A | * | 7/1972 | Freeman et al. ............ 714/779 |
| 4,547,882 A | * | 10/1985 | Tanner ..................... 714/755 |
| 4,723,243 A | * | 2/1988 | Joshi et al. ................ 714/776 |
| 5,040,179 A | * | 8/1991 | Chen ....................... 714/759 |
| 5,276,827 A | * | 1/1994 | Delaruelle et al. .......... 711/217 |
| 5,325,372 A | * | 6/1994 | Ish-Shalom ............... 714/757 |
| 5,335,234 A | * | 8/1994 | Matteson et al. ........... 714/767 |
| 5,383,204 A | * | 1/1995 | Gibbs et al. ............... 714/758 |
| 5,408,478 A | * | 4/1995 | Ohmori et al. ............. 714/756 |
| 5,878,057 A | * | 3/1999 | Maa ....................... 714/757 |
| 5,974,580 A | * | 10/1999 | Zook et al. ................ 714/755 |
| 6,195,780 B1 | * | 2/2001 | Dravida et al. ............. 714/758 |
| 6,332,206 B1 | | 12/2001 | Nakatsuji |
| 6,530,057 B1 | * | 3/2003 | Kimmitt .................... 714/758 |
| 6,615,387 B1 | * | 9/2003 | Williamson et al. ......... 714/785 |
| 6,651,208 B1 | | 11/2003 | Tran |
| 6,718,506 B1 | | 4/2004 | Sebastian et al. |
| 7,103,832 B2 | * | 9/2006 | Leonard et al. ............ 714/807 |
| 7,328,396 B2 | * | 2/2008 | Mann ...................... 714/781 |
| 2002/0002693 A1 | | 1/2002 | Jagadeesh |

OTHER PUBLICATIONS

U.S. Appl. No. 10/912,155, filed Aug. 6, 2004, Hong-Ching Chen.

* cited by examiner

*Primary Examiner*—Joseph D Torres
(74) *Attorney, Agent, or Firm*—Winston Hsu

(57) ABSTRACT

Methods and systems for generating ECC encode a data block to generate corresponding error correction codes. A first buffer sequentially stores a first section and a second section of the data block, wherein each of the first and second sections is composed of X data rows and Y data columns of the data block, and Y is greater than or equal to 2. A second buffer stores Y partial-parity columns. An encoder is used for encoding the first section read from the first buffer to generate the partial-parity columns, and then storing the partial-parity columns in the second buffer. The second section read from the first buffer and the partial-parity columns read from the second buffer are encoded to generate updated partial-parity columns. Next, the partial-parity columns in the second buffer are updated by storing the updated partial-parity columns.

35 Claims, 22 Drawing Sheets

| Row address \ Column address | 0 | 1 | 2 | 3 | ... | 90 | 91 | ... | 111 | ... | 126 | 127 |
|---|---|---|---|---|---|---|---|---|---|---|---|---|
| 0 | $B_{0,0}$ | $B_{0,1}$ | $B_{0,2}$ | $B_{0,3}$ | ... | $B_{0,180}$ | $B_{0,181}$ | | | | | |
| 1 | $B_{1,74}$ | $B_{1,75}$ | $B_{1,76}$ | $B_{1,77}$ | | | $B_{1,0}$ | ... | $B_{1,40}$ | $B_{1,41}$ | $B_{1,70}$ | $B_{1,71}$ $B_{1,72}$ $B_{1,73}$ |
| 2 | $B_{2,148}$ | $B_{2,149}$ | $B_{2,150}$ | $B_{2,151}$ | | | | | | | $B_{2,144}$ $B_{2,145}$ $B_{2,146}$ $B_{2,147}$ |  |
| ... | ... | ... | ... | ... | | | | | | | $B_{4,36}$ $B_{4,37}$ $B_{4,38}$ $B_{4,39}$ |  |
| 147 | ... | ... | | | | | | | $B_{207,180}$ $B_{207,181}$ | | ... | |

Fig. 2 Related Art

METHODS AND SYSTEMS FOR GENERATING ERROR CORRECTION CODES

BACKGROUND OF THE INVENTION

1. Field of the Invention

The present invention relates to methods and systems for generating error correction codes (ECCs), more particularly to methods and apparatuses for an optical disc drive, which efficiently reduces data accessing time during ECC encoding.

2. Description of the Prior Art

Conventional processes for generating error correction codes during encoding involves pre-storing source data in a dynamic random access memory (DRAM). Data stored in the DRAM are usually addressed by the row address and column address, and the DRAM is an array of memory cells accessing according to the row and column addresses.

In order to reduce number of pins on the package, the row and column addresses are multiplexed to share the same address pins. The DRAM is composed of capacitors, and each capacitor stores logic 1 or logic 0 for each data bit by storing the electric charge or not. The row address is sampled from the address pins and latched into the row address decoder when the RAS (Row Address Strobe) signal falls. After the row address is latched, the address on the address pins is switched to the column address and is sampled and latched into the column address decoder when the CAS (Column Address Strobe) signal falls. The data stored in the DRAM corresponding to the latched addresses is output once the CAS signal is stabilized. A technique called "page-mode" allows faster sequential accessing of DRAM, in which a row of DRAM is accessed by only latching the row address once. In the page-mode access, the RAS signal is kept while a new column address is supplied at each falling period of the CAS signal for accessing data from a corresponding memory cell of the DRAM. This technique reduces the column access time and lowers power consumption. The operation of accessing data in the same row is much faster than the operation of accessing data in different rows. For example, in the case of operating a 32 Kb DRAM with 7 bits of row address and 7 bits of column address, the access time required for address change from row to row belonging to the same column is around 5 times the access time for address change from column to column belonging to the same row.

Methods for generating error correction codes, such as generating the parity outer codes (PO codes) of Reed-Solomon product code (RSPC) on a digital versatile disc (DVD), which requires accessing data stored in memory cells with different row addresses. As a result, extensive time is consumed in switching a current row address to a subsequent one for the error correction code generation.

FIG. 1 is a schematic diagram of an ECC block 10 for DVDs. The ECC block 10 includes three regions, which are composed of multiple one-byte elements $B_{i,j}$ (i=0-207, j=0-181). Region 11, composed of elements $B_{i,j}$ with i=0-191 and j=0-171, stores the scrambled source data, Region 12 composed of elements $B_{i,j}$ with i=192-207 and j=0-171 stores the PO codes, and region 13 composed of elements $B_{i,j}$ with i=0-207 and j=172-181 stores the parity inner codes (PI codes). The generation of PO code $B_{i,j}$ with i=192-207 is described by the following remainder polynomial $R_j(X)$ for each column j with j=0-171, in which $G_{po}(x)$ is the PO generation polynomial:

$$R_j(x) = \sum_{i=192}^{207} B_{i,j} x^{207-i} = \left(\sum_{i=0}^{191} B_{i,j} x^{191-i}\right) x^{16} \bmod G_{po}(x) \quad \text{Equation (1)}$$

FIG. 2 is a schematic diagram illustrating an arrangement of the ECC block data stored in a DRAM. Before encoding, a sequence of source data received from a host is scrambled and buffered into the DRAM according to a mapping between the row/column address of memory words and the byte index $B_{i,j}$ of the ECC block as shown in FIG. 2.

The storage unit of the DRAM is a word containing two bytes, and the storing sequence of the scrambled source data is $\{B_{0,0}, B_{0,1}, \ldots B_{0,171}, B_{1,0}, \ldots\}$.

According to the storing sequence, the row addresses of the scrambled source data are frequently switched to generate the PO codes, as each PO column for PO encoding is non-continuous in the direction of memory row address. The encoding process in the PO encoding direction has a low efficiency since large bandwidth and long time are required.

FIG. 3 is a block diagram of an error correction code generator 30 including a first memory (DRAM) 31, a multiplexer 32, and an encoder 33. Source data are provided from the host and stored in the first memory 31 of the ECC generator 30. Each column of the source data ($B_{i,j}$ for i=0~191) is sequentially read out from the first memory 31 for generating the corresponding PO codes ($B_{i,j}$ for i=192~207), in which only one byte of each word read from the first memory 31 is used. The multiplexer 32 selects one of the two bytes in each word and passes it to the encoder 33 for encoding.

For reading one PO column from the DRAM as shown in FIG. 2, it takes 147 times of row-crossing access (reading an element by jumping from one row to another) and 45 times of non-row-crossing access (reading an element in the same row as the previous one), adding up to the total of 192 rows of source data. Based on the previous example, row-crossing access requires five clock cycles, and non-row-crossing access only requires one clock cycle. Therefore, the total number of clock cycles for reading one PO column is 147×5+45=780 clock cycles. The ECC block has a total of 172 PO columns (i=0-171), hence the total amount of time for reading the scrambled source data in order to generate the PO codes is 172×780=134,160 clock cycles. The ratio of page-mode data access to total data access is only 45/(45+147)=23.4%, which is very inefficient.

SUMMARY OF THE INVENTION

Methods and systems for generating error correction codes are provided to reduce the accessing time required for error correction code encoding. In some embodiments, the system encodes a data block to generate corresponding error correction codes, wherein the data block includes a plurality of rows and columns for generating error correction code (ECC) parity columns. A first buffer in the system sequentially stores a first section and a second section of the data block, wherein each of the first and second sections is composed of X data rows and Y data columns of the data block, where Y is greater than or equal to 2. A second buffer stores Y partial-parity columns. An encoder is used for encoding the first section read from the first buffer to generate the partial-parity columns, and then storing the partial-parity columns in the second buffer. The combination of the second section read from the first buffer and the partial-parity columns read from the second buffer are encoded to generate updated partial-parity columns. Next, the partial-parity columns in the second buffer are updated by storing the updated partial-parity columns.

Moreover, to reach the objectives above, the present invention provides another system for generating error correction codes. The system comprises a buffer for sequentially storing a first section and a second section of the data block. An encoder reads the first section from the buffer for encoding the first section, and reads the second section from the buffer for encoding the second section. An address mode switching circuit controls the first section to be stored in the buffer according to a first accessing strategy, controls the second section to be stored in the buffer according to a second accessing strategy, controls the encoder to read the first section from the buffer according to the second accessing strategy, and controls the encoder to read the second section from the buffer according to the first accessing strategy. The first and second accessing strategies are different from one another and are selected from column-by-column and row-by-row accessing strategies.

For reaching the objectives above, some embodiments of the method for encoding a data block to generate corresponding error correction codes allow generating error correction code (ECC) parity columns in a more efficient manner. The method includes sequentially storing a first section and a second section of the data block in a first buffer, wherein each of the first and second sections is composed of X data rows and Y data columns of the data block, where Y is greater than or equal to 2. A group of Y partial-parity columns are stored in a second buffer. The first section read from the first buffer is encoded to generate the partial-parity columns, and the partial-parity columns are stored in the second buffer. Next, the combination of the second section read from the first buffer and the partial-parity columns read from the second buffer are encoded to generate updated partial-parity columns. The partial-parity columns are then updated in the second buffer.

Furthermore, some embodiments of the method for encoding a data block to generate corresponding error correction codes allow generating error correction code (ECC) parity columns in a more efficient manner. The method includes sequentially storing a first section and a second section of the data block in a buffer according to a first accessing strategy and a second accessing strategy, respectively. Next the first section read from the buffer according to the second accessing strategy and the second section read from the buffer according to the first accessing strategy are encoded. The first and second accessing strategies are different from one another and are selected from column-by-column and row-by-row accessing strategies.

In some embodiments, the system for encoding a data block to generate corresponding error correction codes comprises a parity buffer and an encoder. The encoder encodes a first section of the data block to generate partial-parity columns, stores the partial-parity columns in the parity buffer, and encodes a second section of the data block with the partial-parity columns read from the parity buffer to generate new partial-parity columns. Each of the first and second sections is composed of X data rows and Y data columns, where Y is greater than or equal to 2, and X is smaller than the total number of rows in the data column.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 shows a schematic diagram illustrating the arrangement of the scrambled source data in a DRAM.

DETAILED DESCRIPTION

Figure 4:
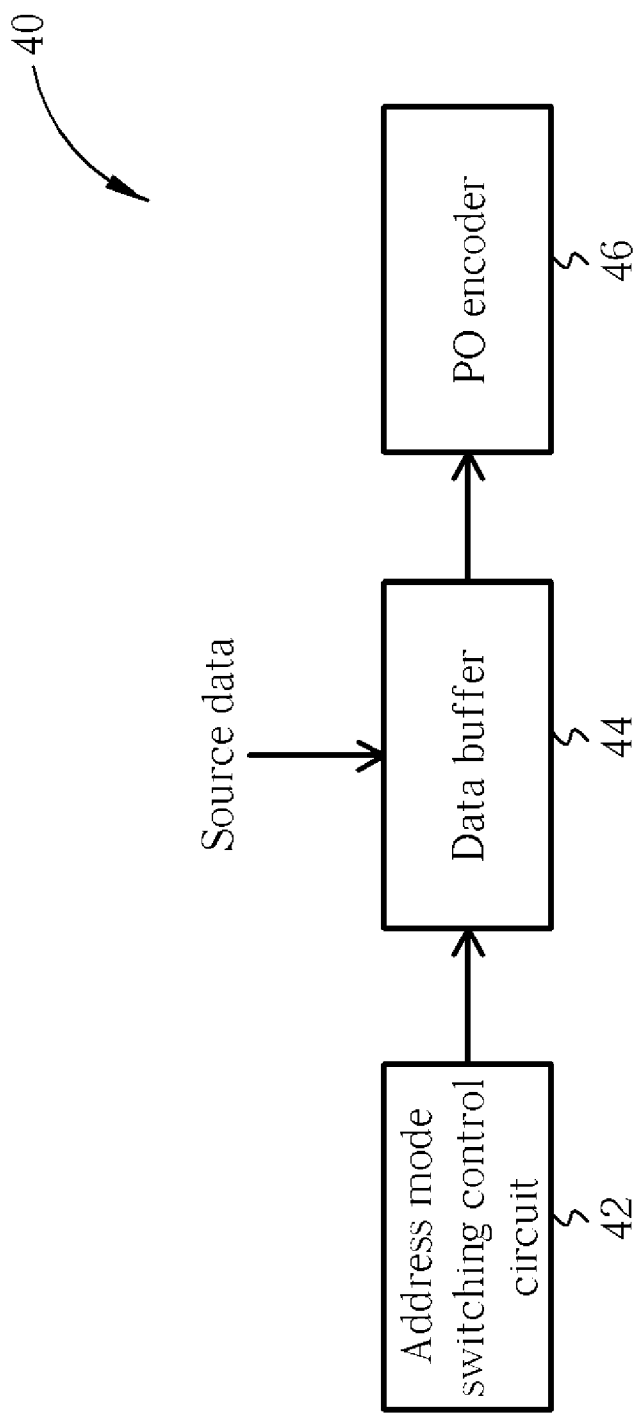
FIG. 4 is a block diagram of an error correction code generators in accordance with an embodiment of the present invention.

FIG. 4 is a block diagram of an error correction code generator 40 in accordance with an embodiment of the present invention. A data buffer 44 sequentially stores a plurality of sections of source data from the data block 11 shown in FIG. 1. The data buffer 44 is preferably a static random access memory (SRAM) due to its fast access times, but other memory types can also be used. An address mode switching control circuit 42 controls the way that the source data is stored in the data buffer 44. A PO encoder 46 then encodes the source data stored in the data buffer 44 for producing the PO parity data. As will be explained below, the address mode switching control circuit 42 toggles the methods of accessing the data buffer 44 for increasing memory access speeds during the PO encoding process. The address mode switching control circuit 42 switches the memory access mode to read and write row-by-row or column-by-column.

Figure 1:
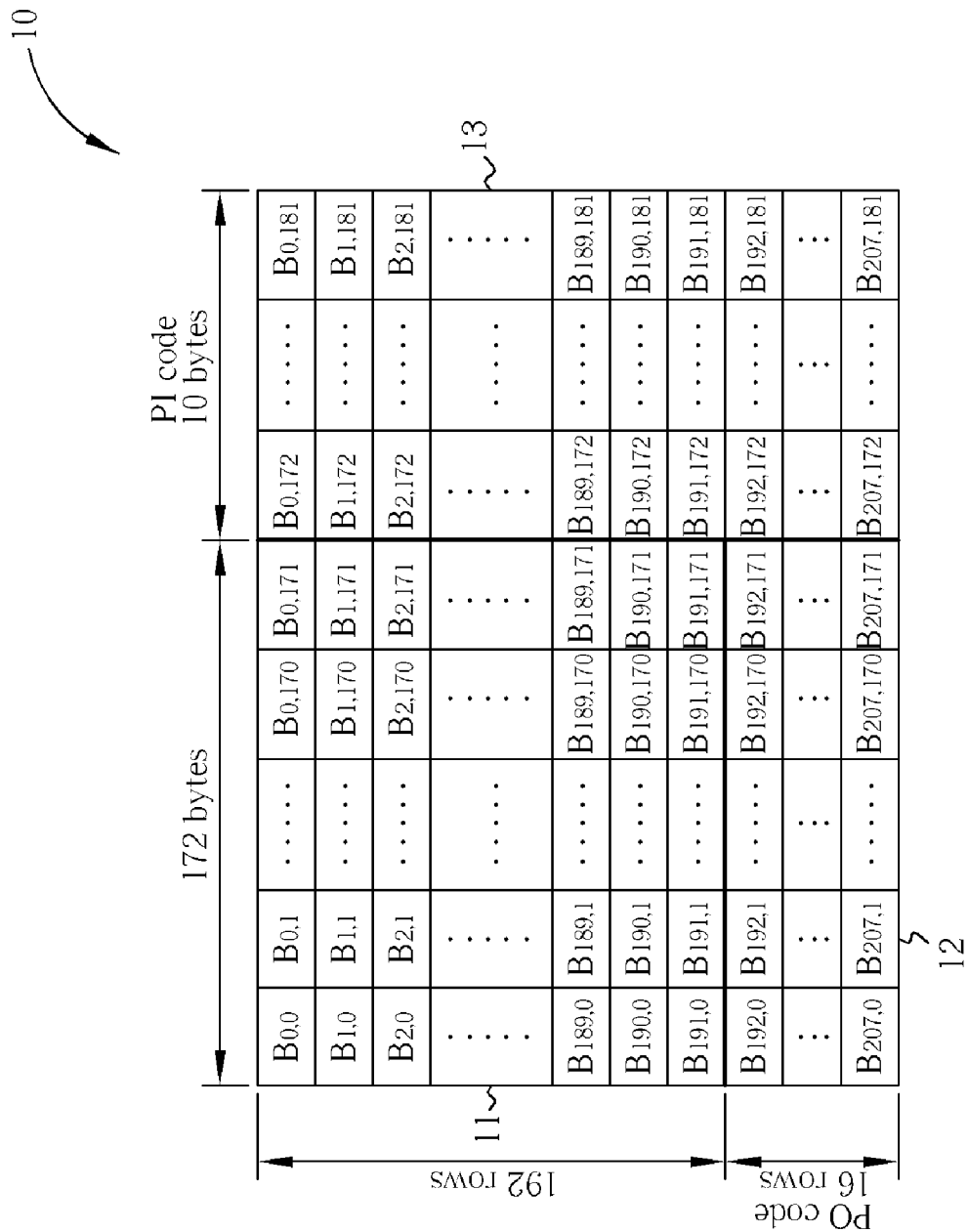
FIG. 1 shows a schematic diagram of an ECC block.
Figure 5:
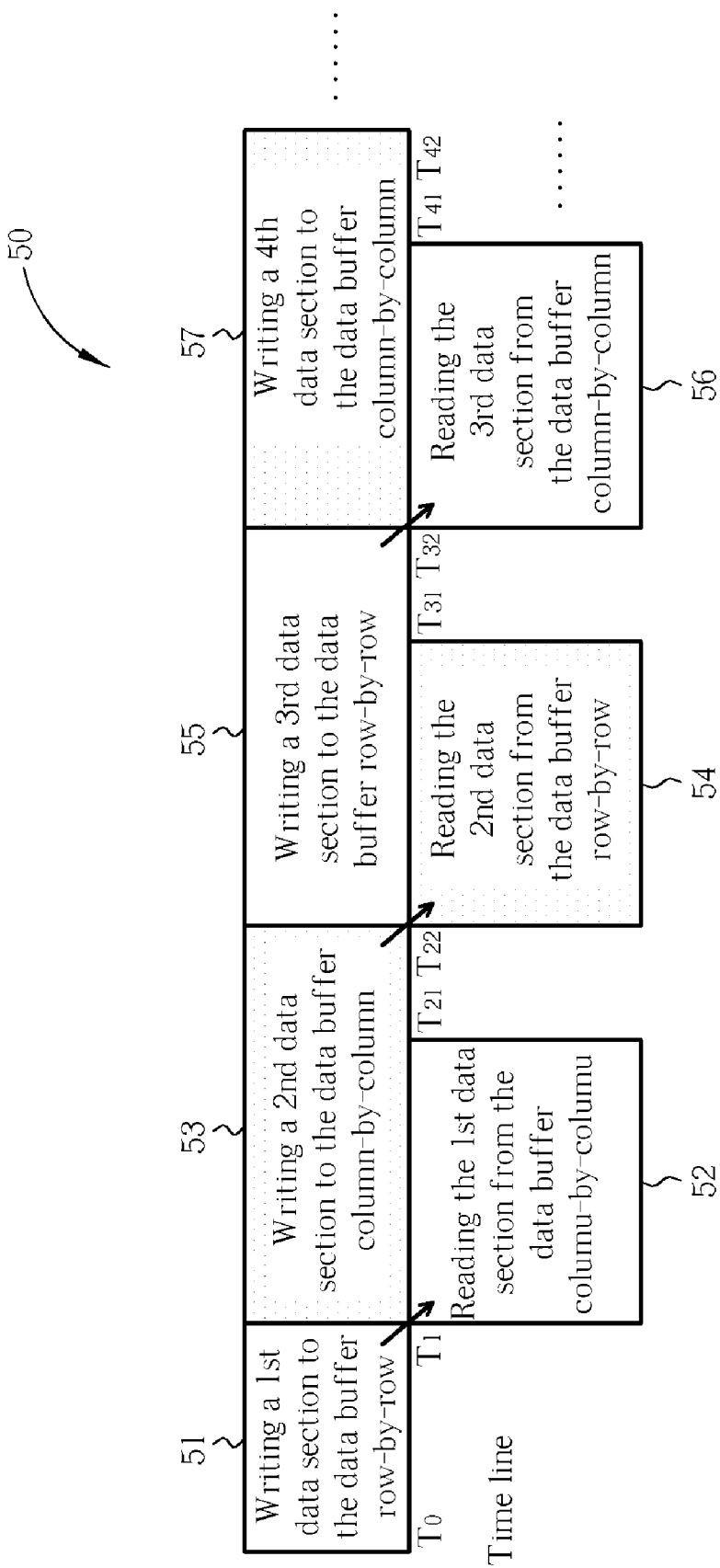
FIG. 5 shows a diagram illustrating the schedule of data writing and data reading operation in accordance with an embodiment of the present invention.

FIG. 5 shows a diagram 50 illustrating the schedule of data writing and data reading operation in accordance with an embodiment of the present invention. The data block 11 of FIG. 1 is divided into a plurality of data sections including 1st, 2nd, 3rd, 4th data sections, etc. Each data section is composed of a plurality of rows and a plurality of word columns, such as 192 rows and 4 word columns (8 bytes). First, the 1st data section is written into the data buffer 44 row-by-row in step 51 starting at time $T_0$. After the whole 1st complete data section is written into the data buffer 44, the stored data are read from the data buffer 44 column by column for generating PO parity data in step 52 starting at time $T_1$. After the first (leftmost) column of the 1st data section is all read, the first column of the 2nd data section can be overwritten in step 53 to the same memory space of the data buffer 44 where the first column of the 1st data section was stored. The remaining columns of the 2nd data section are written to the data buffer 44 in the same fashion. Thus, the 2nd data section is effectively written to the data buffer 44 at the same time as the 1st data section is being read from the data buffer 44, while avoiding any previous data from being overwritten before it is read. After the whole 2nd data section is written to the data buffer 44, it is again read out from the data buffer 44 row-by-row in step 54 for generating PO parity data. Similarly, in step 55, each row of the 3rd data section can be overwritten to the same memory space of the data buffer 44 where corresponding rows of the 2nd data section is completely read from the data buffer 44. The columns of the stored 3rd data section are not read from the data buffer 44 in step 56 until the whole 3rd data section is written into the data buffer 44 row-by-row. This process repeats, and in step 57, the 4th data section is written to the data buffer 44 column-by-column while the 3rd data section is read from the data buffer 44 column-by-column. Please note that in the above process, an $N_{th}$ data section is read while an $(N+1)^{th}$ data section is being written. Moreover, the simultaneous read and write processes are performed in the same direction, whether it be row-by-row or column-by-column. The writing operations for PO buffering and the reading operations for PO encoding act simultaneously without any additional PO encoder or extra memory size by accessing the data buffer 44 in the same direction. Accessing the data buffer 44 in the same direction also allows the reading and writing to take place simultaneously without adversely affecting the memory access speed.

Figure 6:
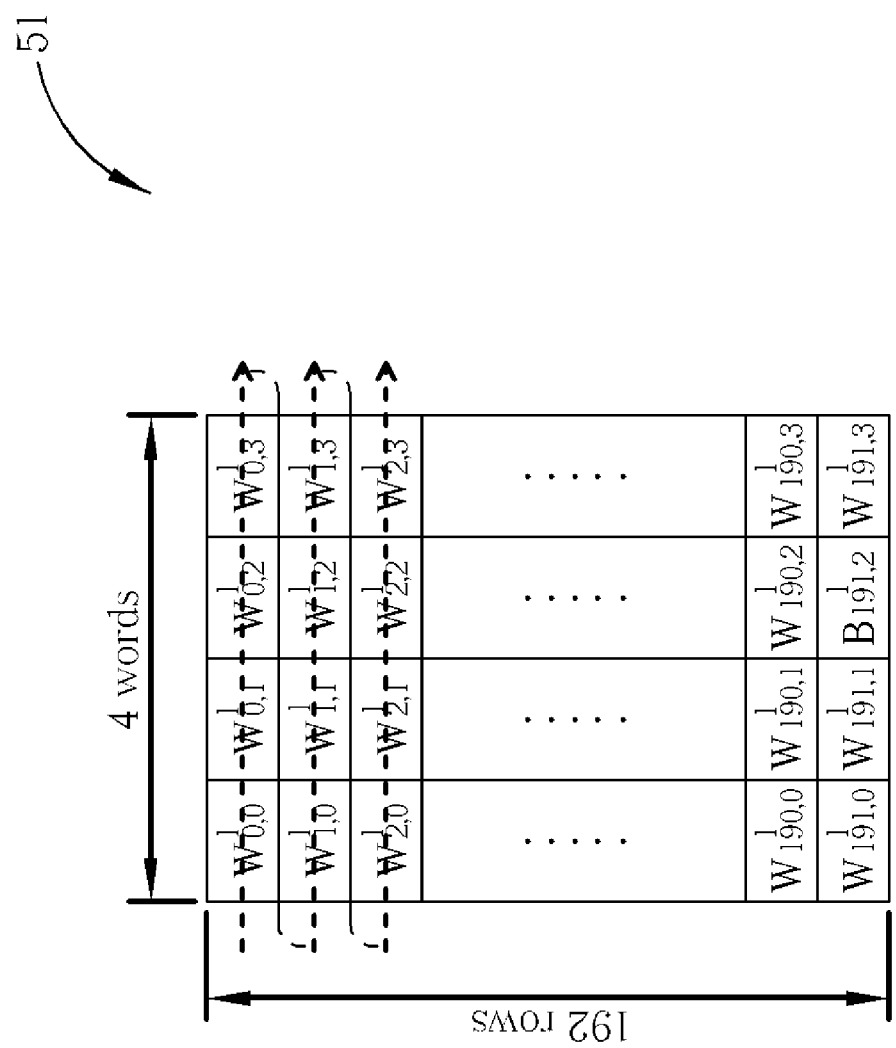
FIGS. 6-10 are diagrams illustrating a data reading sequence in accordance with an embodiment of the present invention.
Figure 7:
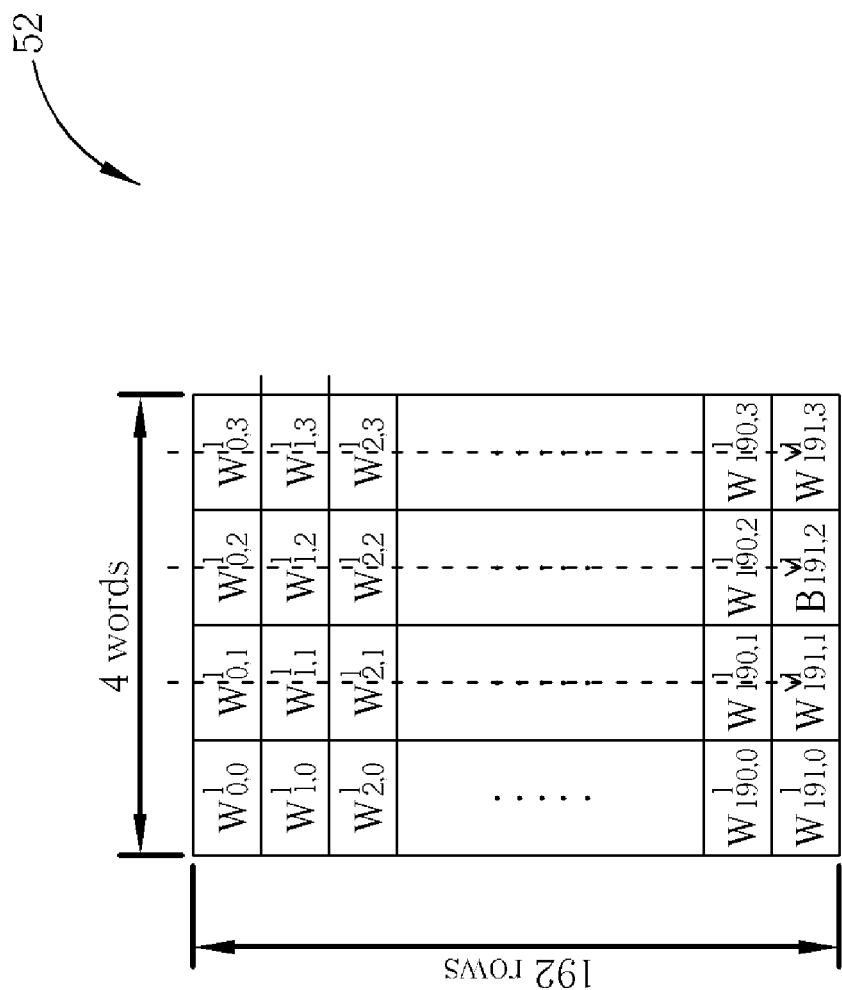
Figure 8:
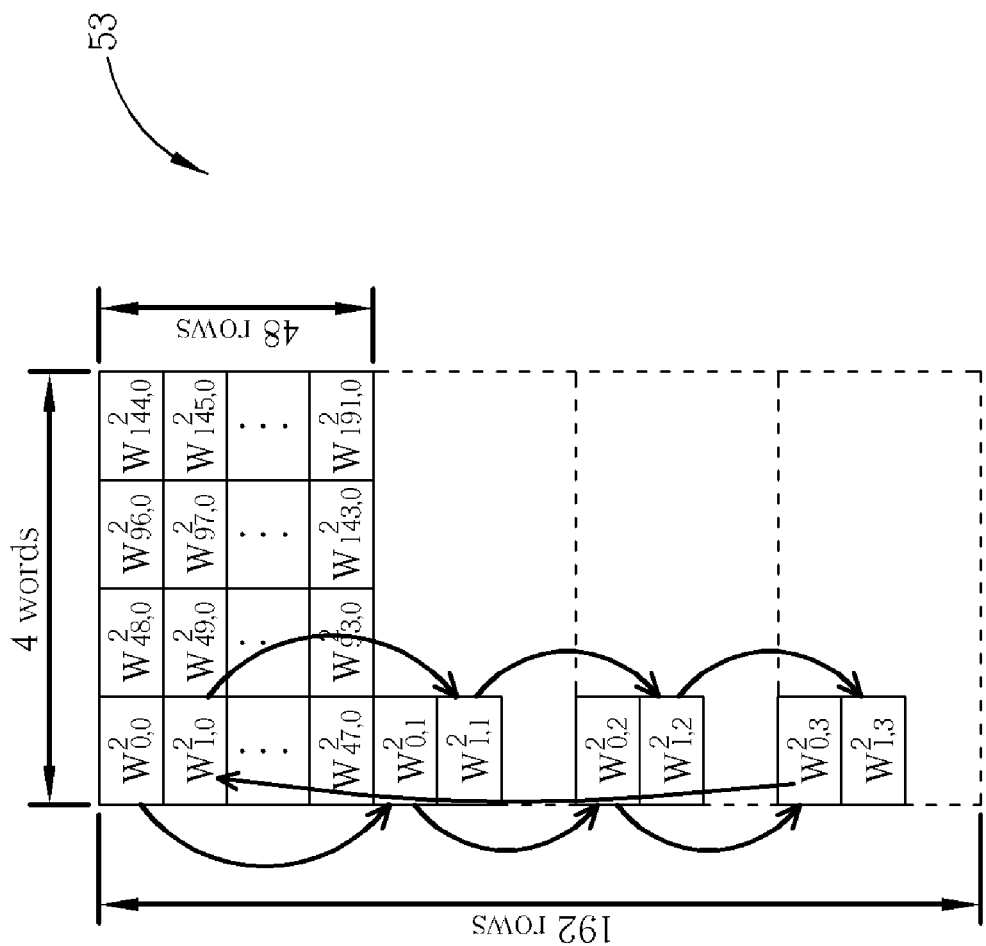

FIGS. 6-10 show diagrams illustrating data reading sequences in accordance with an embodiment of the present invention. FIGS. 6-10 correspond to steps 51-55, respectively. Two horizontally adjacent bytes act as a word $W^i_{x,y}$, where i is the designed number of the data section, x is a row number ranging from 0 to 191, and y is a column number ranging from 0 to 3. In this example, each data section is comprised of 192 rows and 4 word columns. First, the 1st data section is written into the data buffer 44 row-by-row as shown in FIG. 6. The data writing sequence in the data buffer 44 is shown by the arrows, and starts from the topmost row. The data reading sequence in the data buffer 44 is also shown by the arrows in FIG. 7, and starts from the leftmost column. After the first (leftmost) column of the 1st data section is completely read from the data buffer 44, the first to 48th rows of the 2nd data section can be overwritten to the same memory space of the data buffer 44 where the first column of the 1st data section was recorded. As shown in FIG. 8, words $W^2_{0,0}$-$W^2_{1,3}$ are sequentially stored as the serial directions of theses arrows indicate, with sequential words in a row of the 2nd data section being stored in sequential 48-rows groups of the data buffer 44. The remaining rows of the 2nd data section are written to the data buffer 44 according to the same accessing strategy. The first column of the 2nd data section is stored in the upper 48 rows of the data buffer 44, the second column of the 2nd data is stored in the next 48 rows of the data buffer 44, and so forth.

Figure 9:
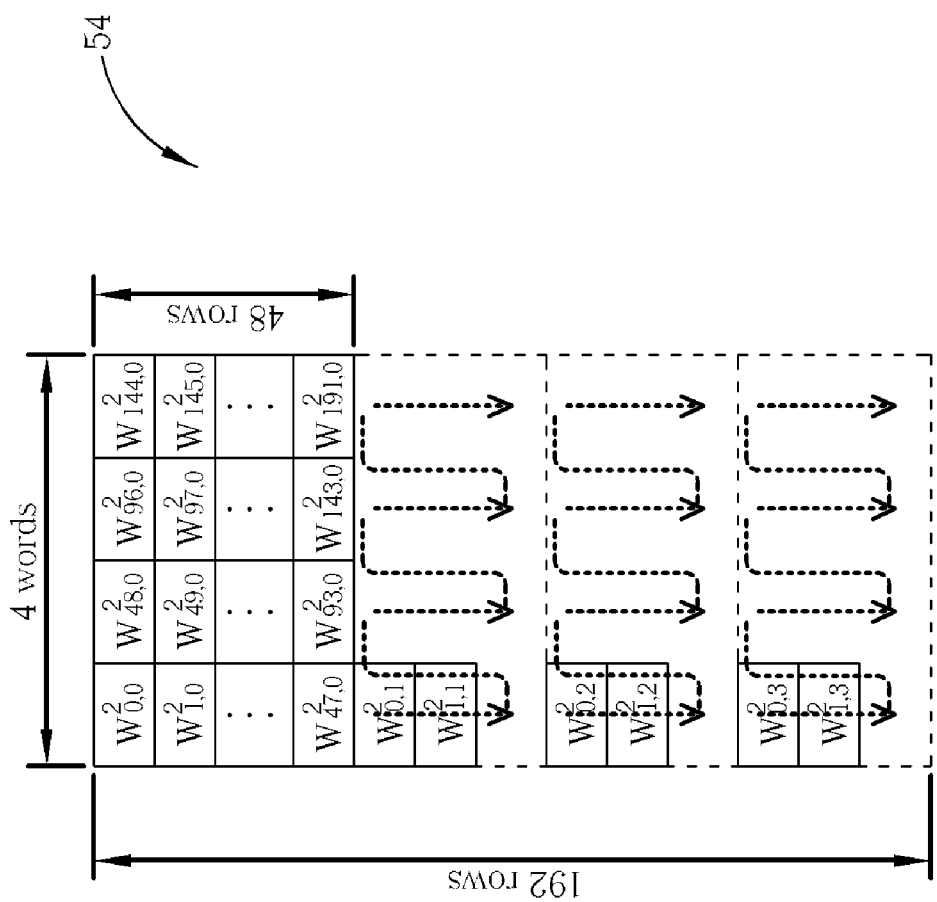
Figure 10:
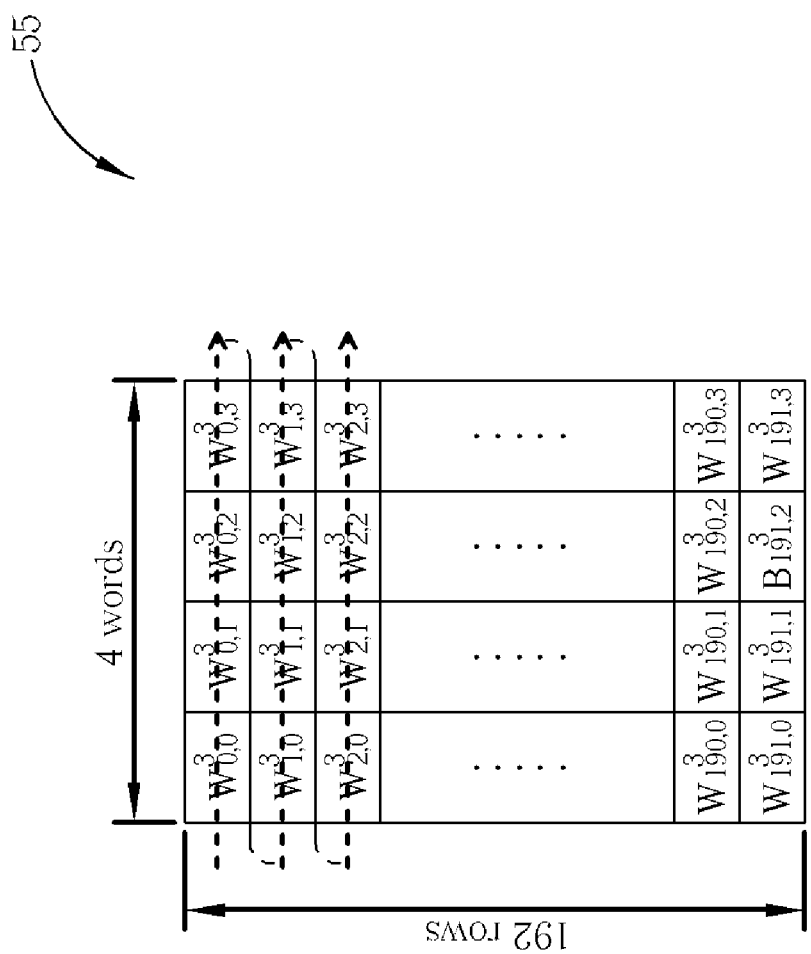

As shown in FIG. 9, after the entire 2nd data section is written to the data buffer 44, the stored data are read from the data buffer 44 for generating PO parity data in a sequence as the serial directions of these arrows indicate. The consecutive 48 data rows of the data buffer 44 are accessed column-by-column since each group of 48 rows of the data buffer 44 contains the stored data for one word column of the 2nd data section. After reading each of the 48-rows groups, the 3rd data section is written into the data buffer 44 row-by-row, as shown in FIG. 10.

Figure 11:
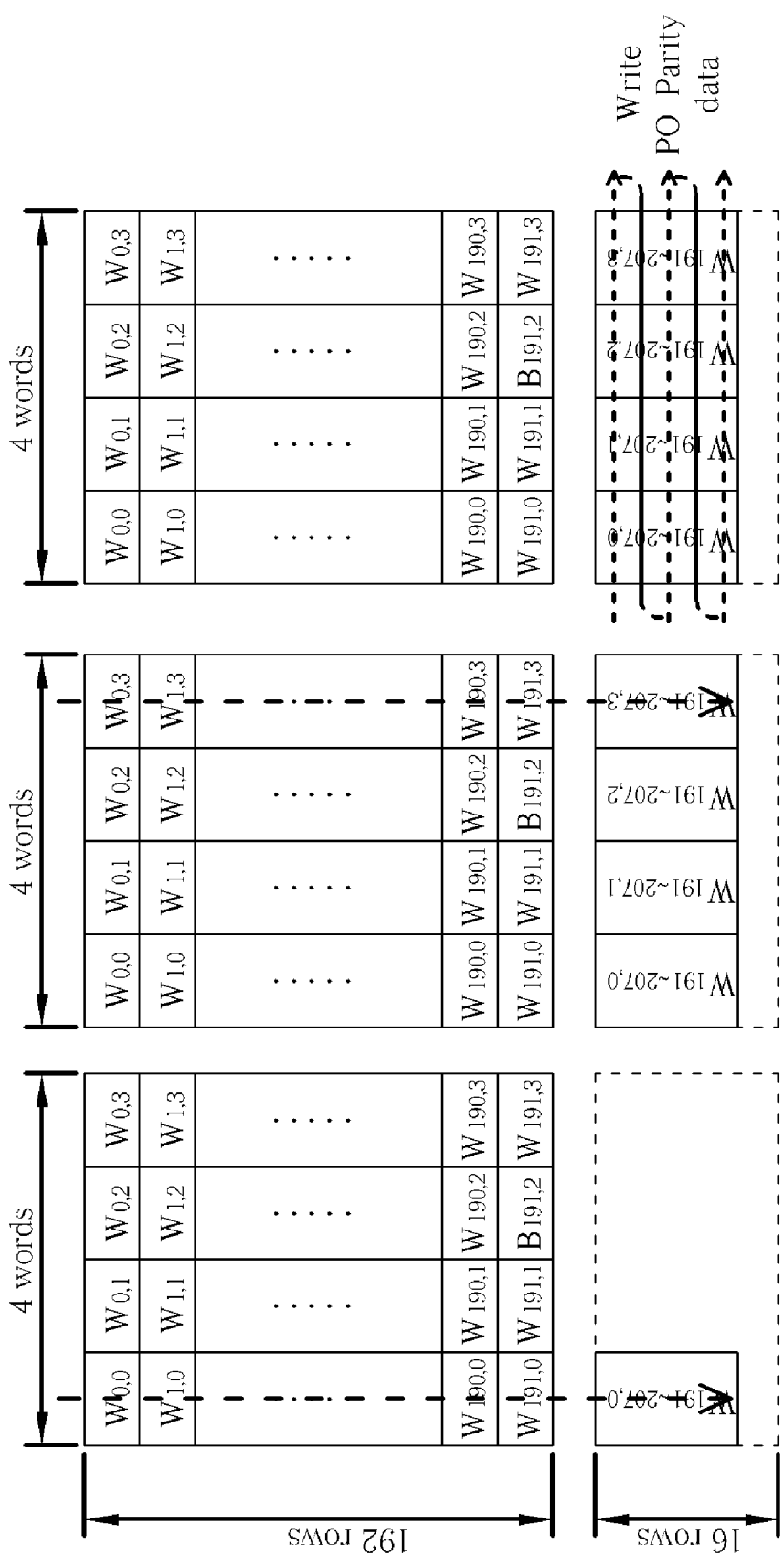
FIG. 11 illustrates an exemplary method of generating PO parity data for each word column of memory when reading the memory column-by-column.

After reading each data section stored in the data buffer 44, the corresponding PO parity data is calculated and written to a PO parity buffer with a size of at least 16 rows and 4 word columns. For instance, FIG. 11 illustrates how PO parity data is generated for each word column of memory when reading the data buffer 44 column-by-column. After each word column of data is read, corresponding PO parity data is written into one word column of the PO parity buffer. After the last word column has been read and encoded, and the corresponding PO parity data has been stored in the PO parity buffer, the PO parity is read out row-by-row and stored in a memory, such as a DRAM, which can be used for generating PI codes. By reading the PO parity out of the PO parity buffer row-by-row, page-mode data access can be efficiently used for enabling quick memory access.

Figure 12:
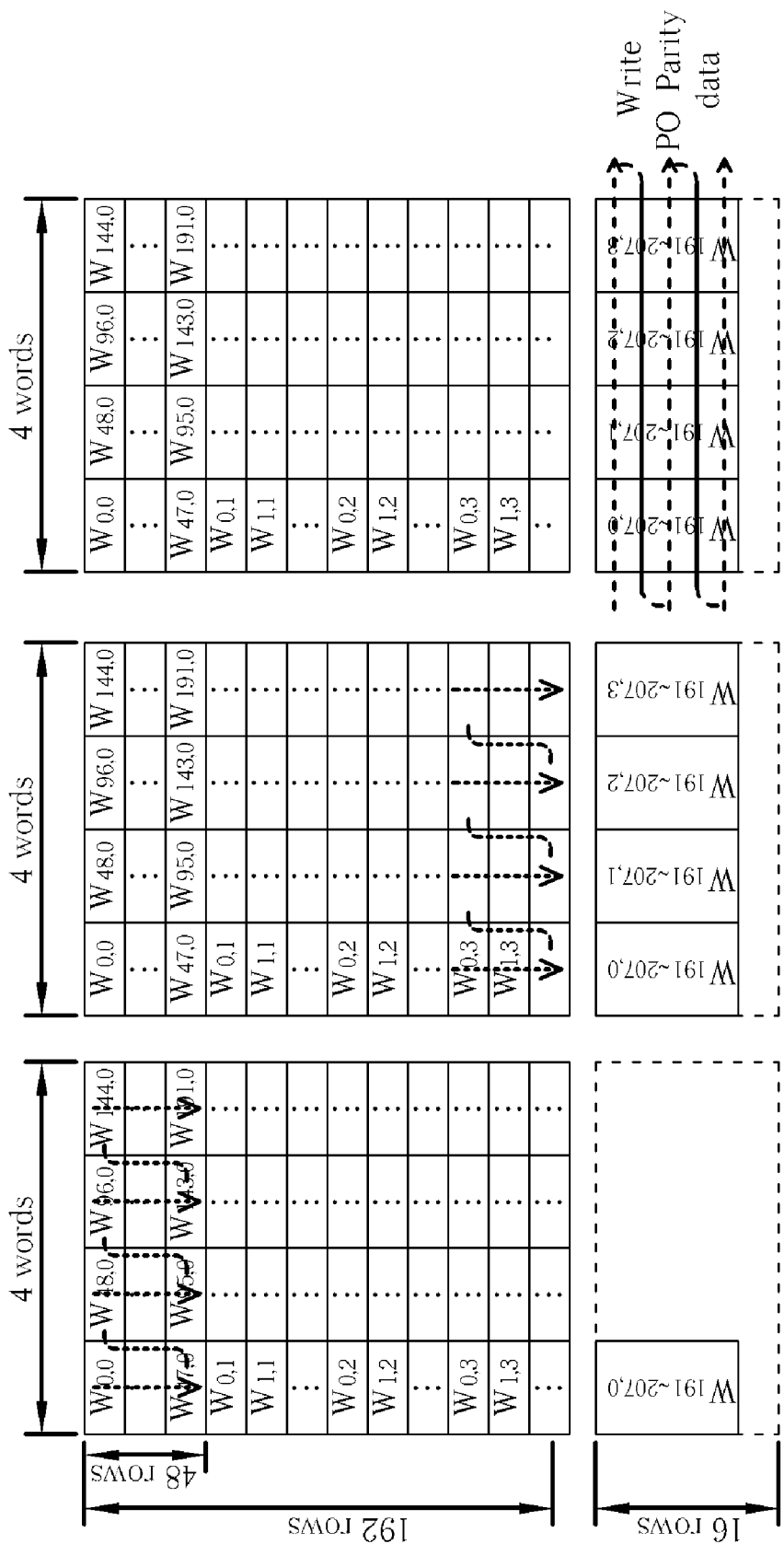
FIG. 12 illustrates an exemplary method of generating PO parity data for each group of rows of memory when reading the memory row-by-row.

FIG. 12 illustrates how PO parity data is generated for each group of rows of memory when reading the memory row-by-row. After each group of 48 rows of data is read, corresponding PO parity data is stored into the PO parity buffer. After the last group of rows of data is read, and the corresponding PO parity data is stored in the PO parity buffer, the PO parity data is read out row-by-row and stored in the DRAM.

Figure 13:
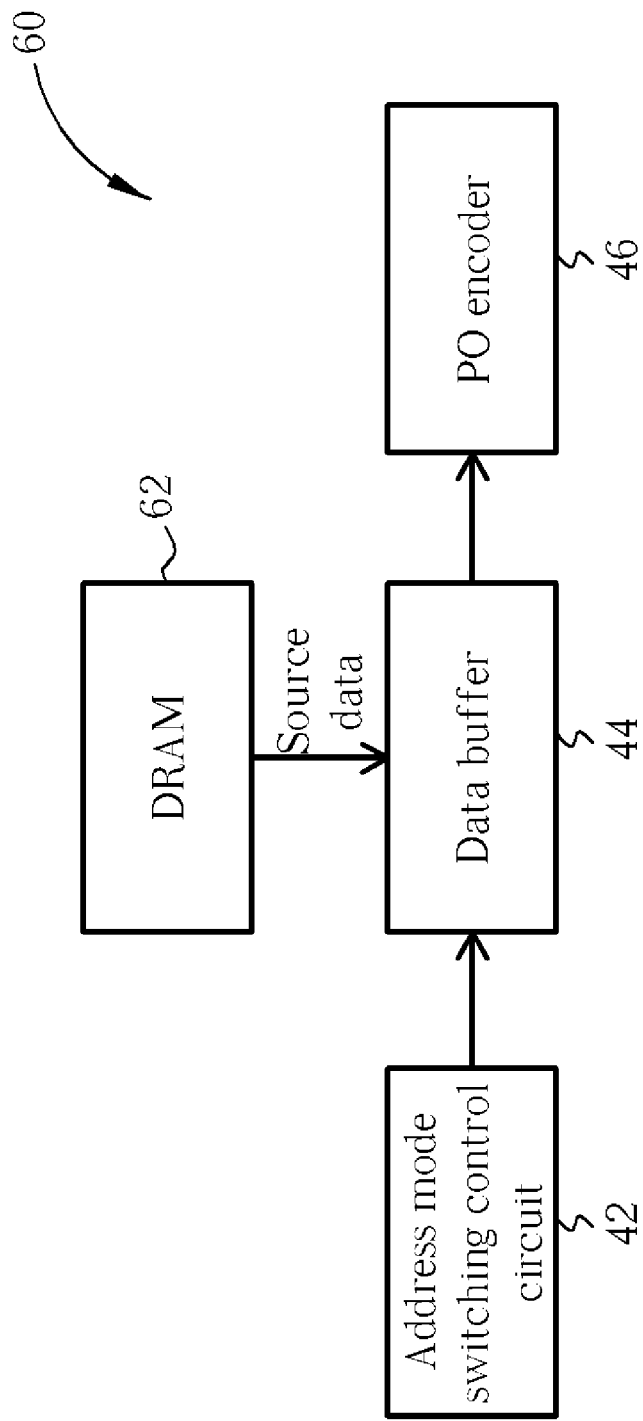
FIGS. 13-15 are block diagrams of error correction code generators in accordance with some embodiments of the present invention.
Figure 14:
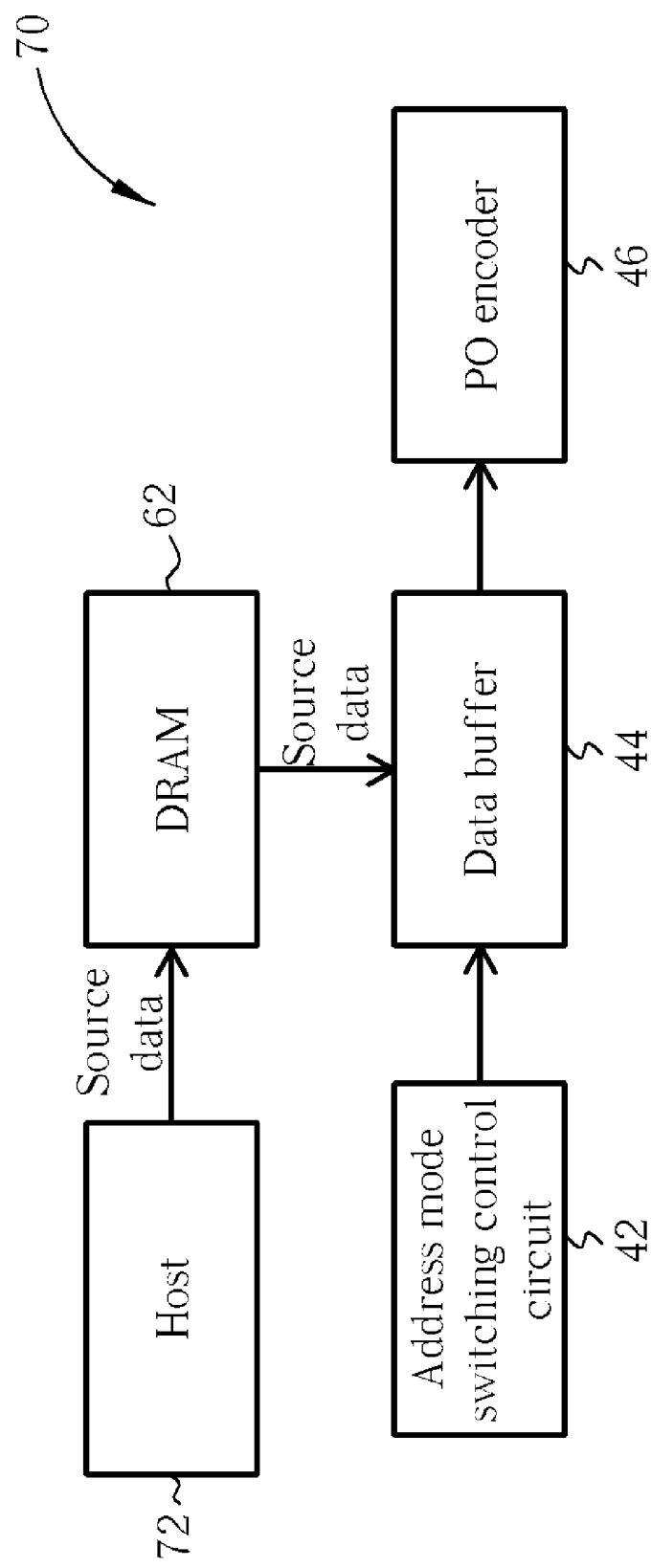
Figure 15:
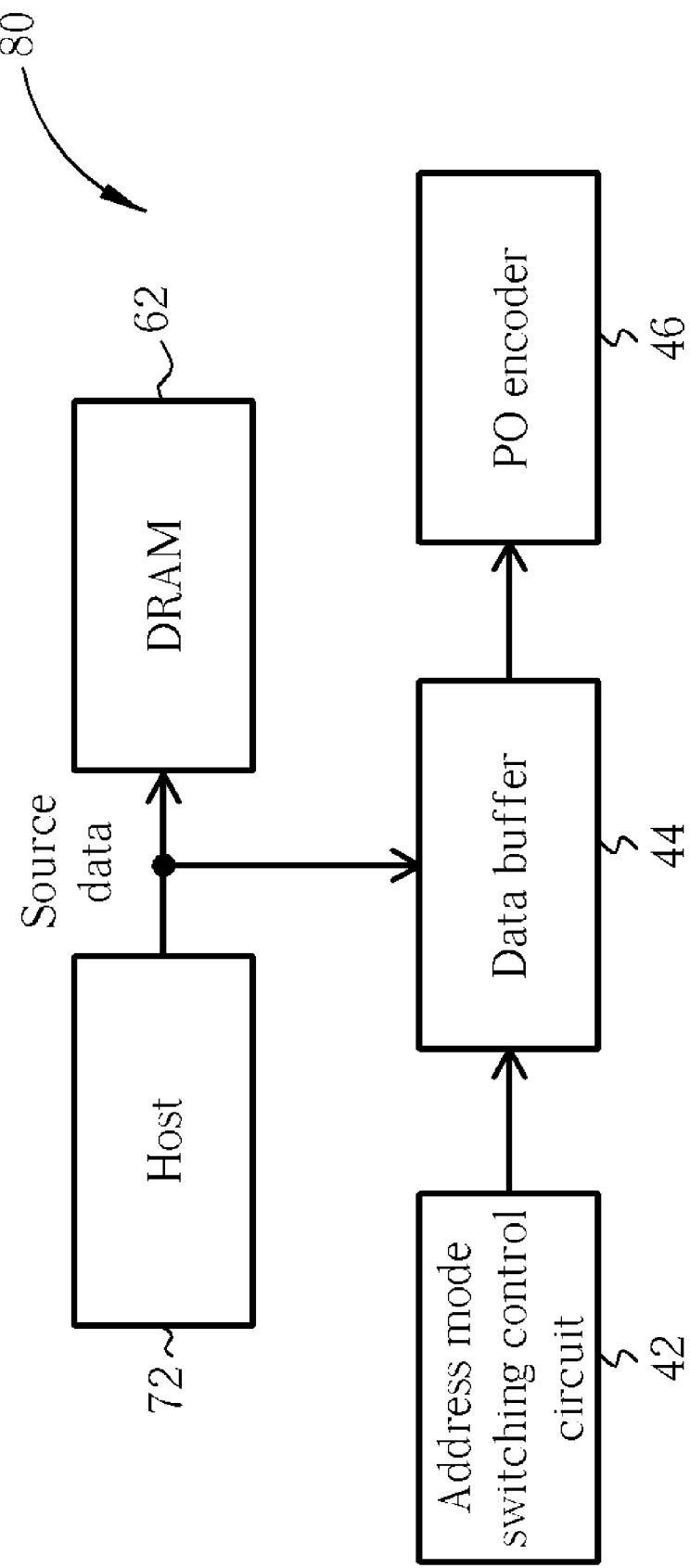

FIGS. 13-15 are block diagrams of error correction code generators in accordance with some embodiments of the present invention. Differing from the error correction code generator 40 of FIG. 4, the error correction code generator 60 shown in FIG. 13 contains a DRAM 62 for supplying source data to the data buffer 44. Alternatively, as shown in the error correction code generator 70 of FIG. 14, a host 72 can also be used to supply the source data to the DRAM 62. The DRAM 62 stores the source data for the data buffer 44 to read for encoding the PO parity data. However, instead of the host 72 supplying the source data to the DRAM 62 and the DRAM 62 supplying the source data to the data buffer 44, the host 72 can also supply the source data to the data buffer 44 directly, as shown in the error correction code generator 80 of FIG. 15. A copy of the source data can also be stored in the DRAM 62 for use in encoding PI codes later. Since the encoding process performed by the PO encoder 46 is usually faster than the transmission speed of the host 72, the host 72 can supply the source data to the data buffer 44 directly without the problem of buffer overflow.

FIG. 16(*a*) is a block diagram of an error correction code generator 100 in accordance with another embodiment of the present invention. The error correction code generator 100 uses recursive PO encoding calculation to reduce the size of buffers needed to calculate the PO parity data. A DRAM 102 supplies source data to a data buffer 104. The data buffer 104 can have a relative small size such as 16 words×16 rows in comparison with the memory size of the DRAM 102. After a first group of source data is stored in the data buffer 104, the data buffer 104 outputs the source data to a PO encoder 106, where the first group of source data is the first 16 rows of a 16-word column. Note that the source data is divided into groups having 16 words and 16 rows in this embodiment; however, various group sizes may be used to generate the PO parity data by such recursive PO encoding calculation. The PO encoder 106 generates partial PO parity data based of the first group and stores in a parity buffer 108. Meanwhile, the data buffer 104 reads in a second group of source data, which in this embodiment, is the next 16 rows of the 16-word column. The second group of source data is output from the data buffer 104 to a summing circuit 105 and the partial PO parity data stored in the parity buffer 108 is simultaneously output to the summing circuit 105. The summed result is sent to the PO encoder 106, where the PO encoder 106 generates updated partial PO parity data to be stored in the parity buffer 108. Meanwhile, a third group of source data is stored in the data buffer 104. The summing circuit 105 sums the third group of source data with the updated partial PO parity data stored in the parity buffer 108 and sends the result to the PO encoder 106 for generating the new updated partial PO parity data. This recursive PO encoding operation continues until all groups of source data belonging to the same 16-word column have been used to encode the corresponding PO parity data. As shown in FIG. 1, 12 iterations of this process would be required to encode the corresponding PO parity data if 16 rows of the 192 rows of source data are encoded at a time. The PO parity data that have been encoded are then stored in the DRAM for use in calculating the PI codes. An example of the recursive PO encoding calculation is that the size of a group of source data is 16 words×16 rows, and the calculation can be described by the following recursive remainder polynomial $R_j^k(X)$ for each column j with j=0-171, in which $G_{po}(x)$ is the PO generation polynomial:

$$R_j^k(x) = \sum_{i=0}^{15} R_{i,j}^k x^{15-i} \quad \text{Equation (2)}$$

$$= \left( R_j^{k-1}(x) + \sum_{i=0}^{15} B_{(16*k+i),j} x^{15-i} \right) x^{16} \bmod G_{po}(x)$$

$$= \left( \sum_{i=0}^{16*k+15} B_{i,j} x^{16*k+15-i} \right) x^{16} \bmod G_{po}(x)$$

$$= \left( \sum_{i=0}^{15} (R_{i,j}^{k-1} + B_{(16*k+i),j}) x^{15-i} \right) x^{16} \bmod G_{po}(x)$$

where $R_j^{-1}(x) =$ $$0 \text{ and } R_j^{11}(x) = \left( \sum_{i=0}^{191} B_{i,j} x^{191-i} \right) x^{16} \bmod G_{po}(x) = R_j(x)$$

Figure 16A:
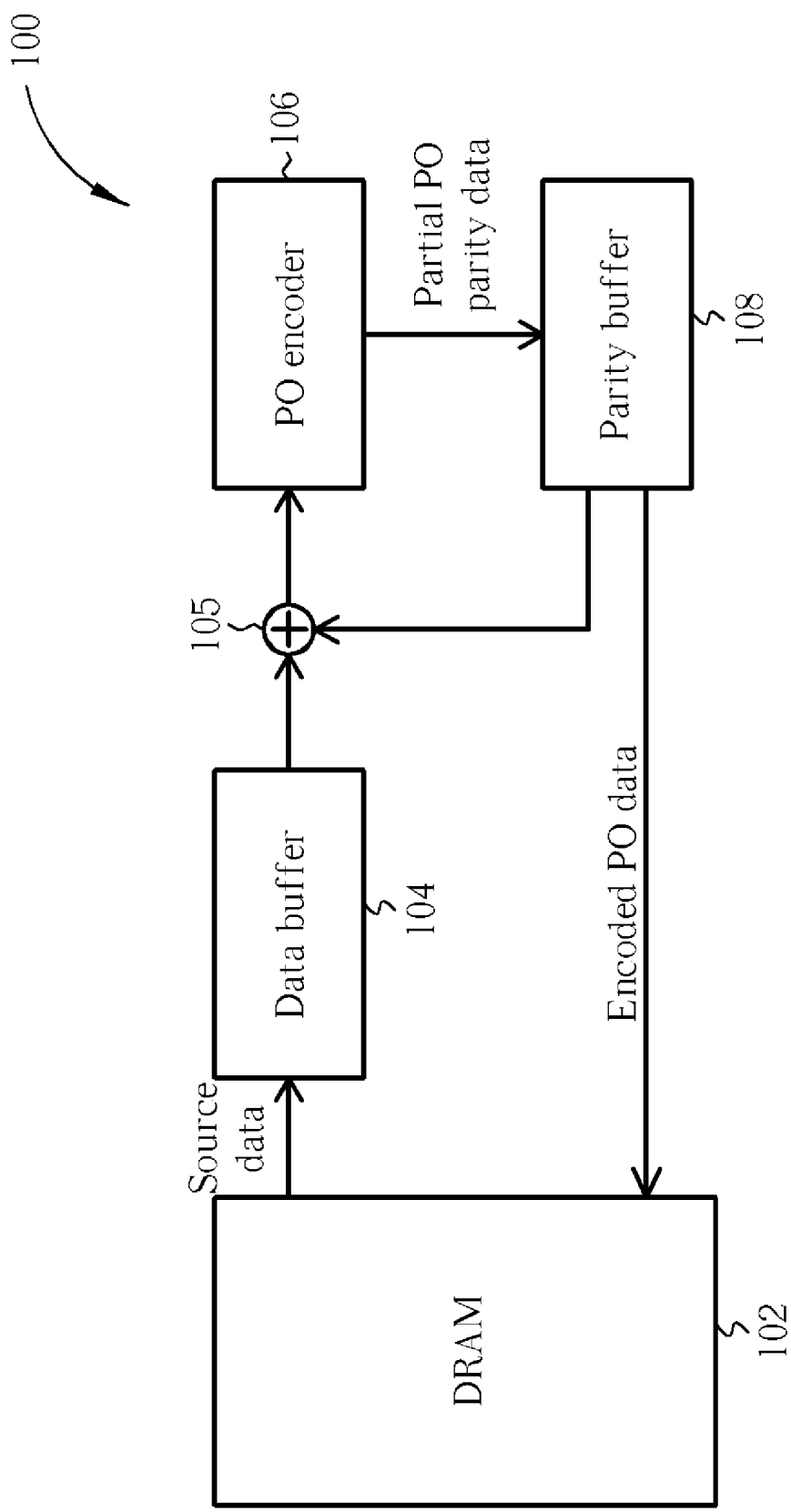
FIGS. 16(a)-(b) are block diagram of an error correction code generator in accordance with another embodiment of the present invention.
Figure 16B:
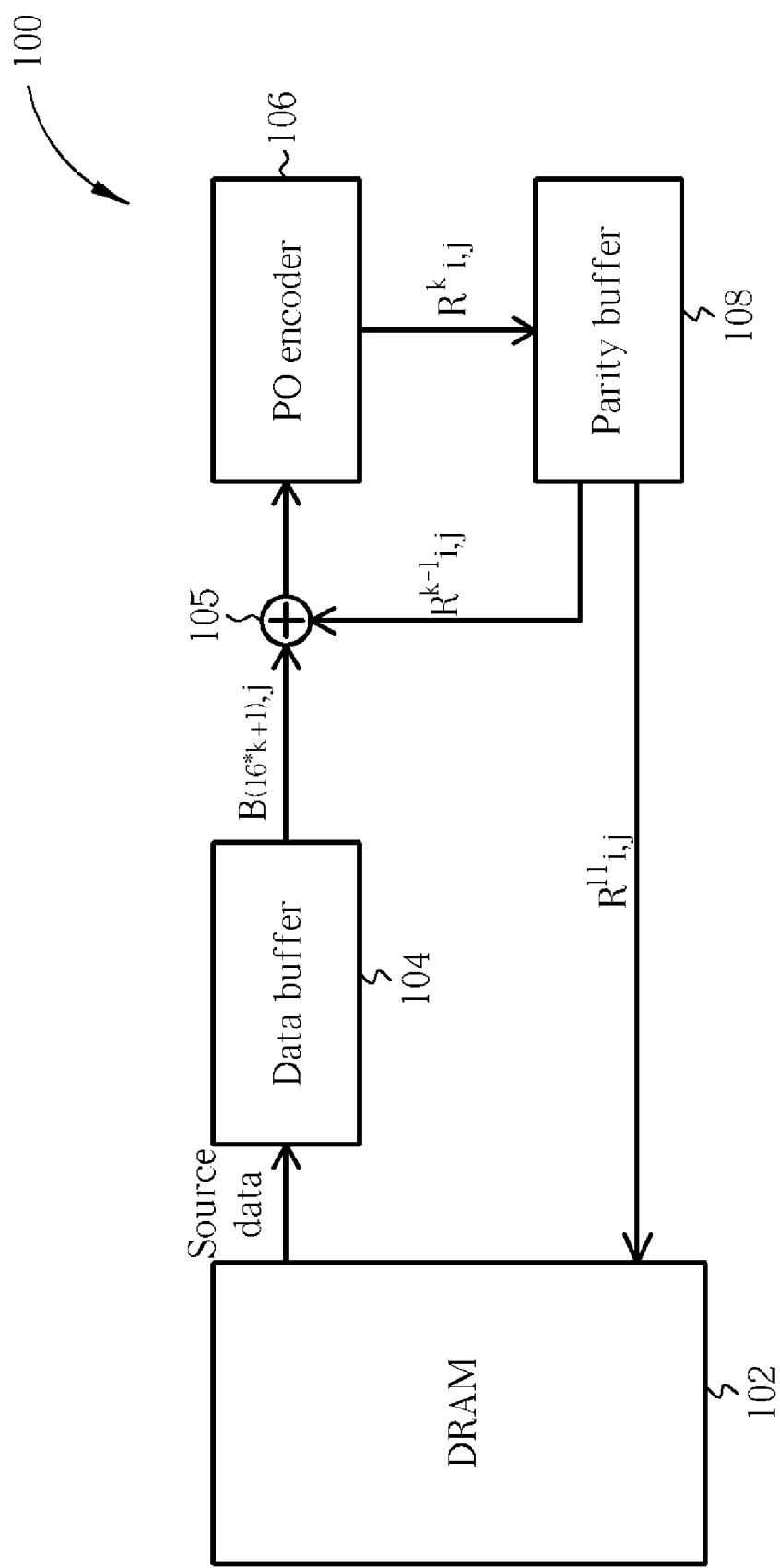

FIG. 16(b) is the same as FIG. 16(a) while labeling the related symbols of Equation (2) to show how Equation (2) is realized in the block diagram of FIG. 16(a). By using the error correction code generator 100 implementing the recursive PO encoding process, two small buffers can be used. In this example, both the data buffer 104 and the parity buffer 108 only require a size of 256 words (512 bytes), which greatly reduces the amount of SRAM needed for the buffers. In addition, the partial PO parity data can be read out of the parity buffer 108 at the same time as the source data is read out of the data buffer 104, so no extra time is needed to wait for the partial PO parity data to be read. Since the data buffer 104 stores many words from the same row of the source data at a time, these adjacent words can be read with the advantage of page-mode data access. In addition, when the encoded PO data is written back to the DRAM 102, page-mode data access can be utilized for writing adjacent PO data words in the same row of memory. In addition, instead of summing up the partial PO parity data and source data to be encoded concurrently, it can reload the partial PO parity data to the PO encoder 106 before encoding the next group of source data.

Figure 3:
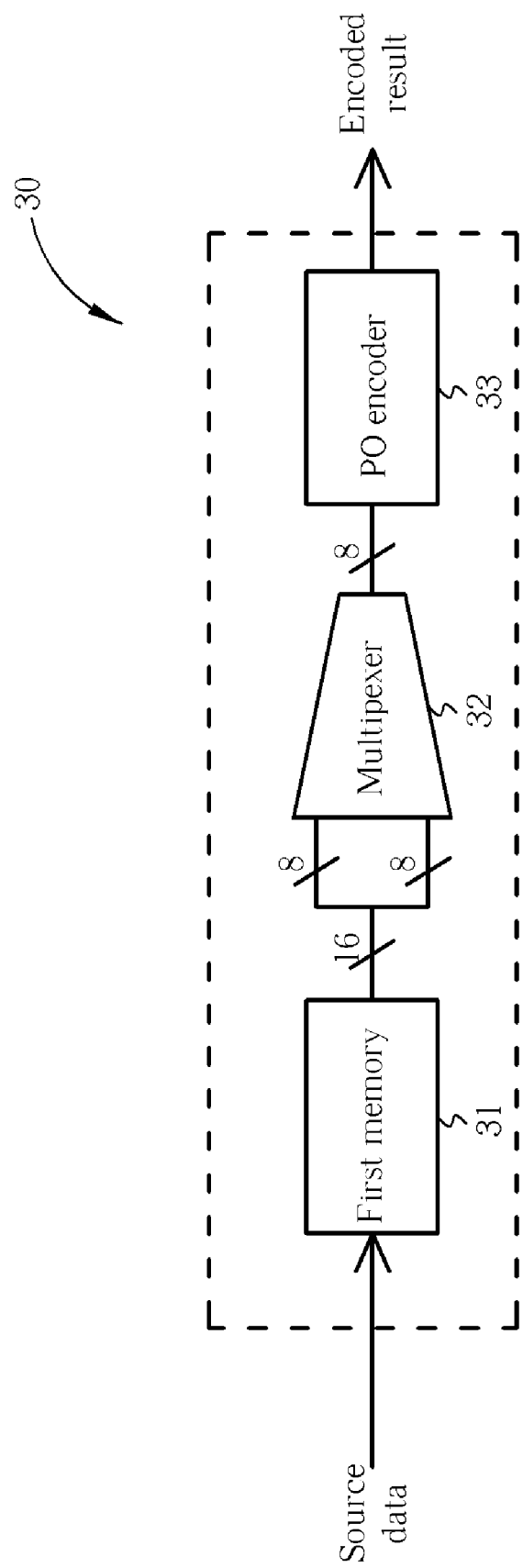
FIG. 3 shows a block diagram of a conventional error correction code generator.

Please refer to FIG. 2 along with FIG. 16. Reading one group of 32 columns of source data (corresponding to 16 words of source data) requires 147 times of row-crossing access and (192×16-147) times of non-row-crossing access. From the above DRAM specification showing the number of clock cycles needed to read data, the required number of cycles required for reading one group of 32 columns of source data is 147×5+(192×16-147)=3660 cycles. Since a whole ECC block has (172/32) groups of 32 PO columns, the total required cycles are (172/32)×3660=19,672 cycles, which is only 14.7% of the 134,160 cycles required in the error correction code generator 30 shown in FIG. 3. In addition, the ratio of page-mode data access to total data access is (192×16-147)/(192×16)=95%, which is a significant improvement over that of the error correction code generator 30 shown in FIG. 3. Therefore, executing the PO parity data encoding process recursively enables smaller buffers to be used, and accessing more than 1 word such as 16 words in the same row of the source data at a time enables more frequently utilizing page-mode access to significantly reduce the overall DRAM access time.

Figure 17:
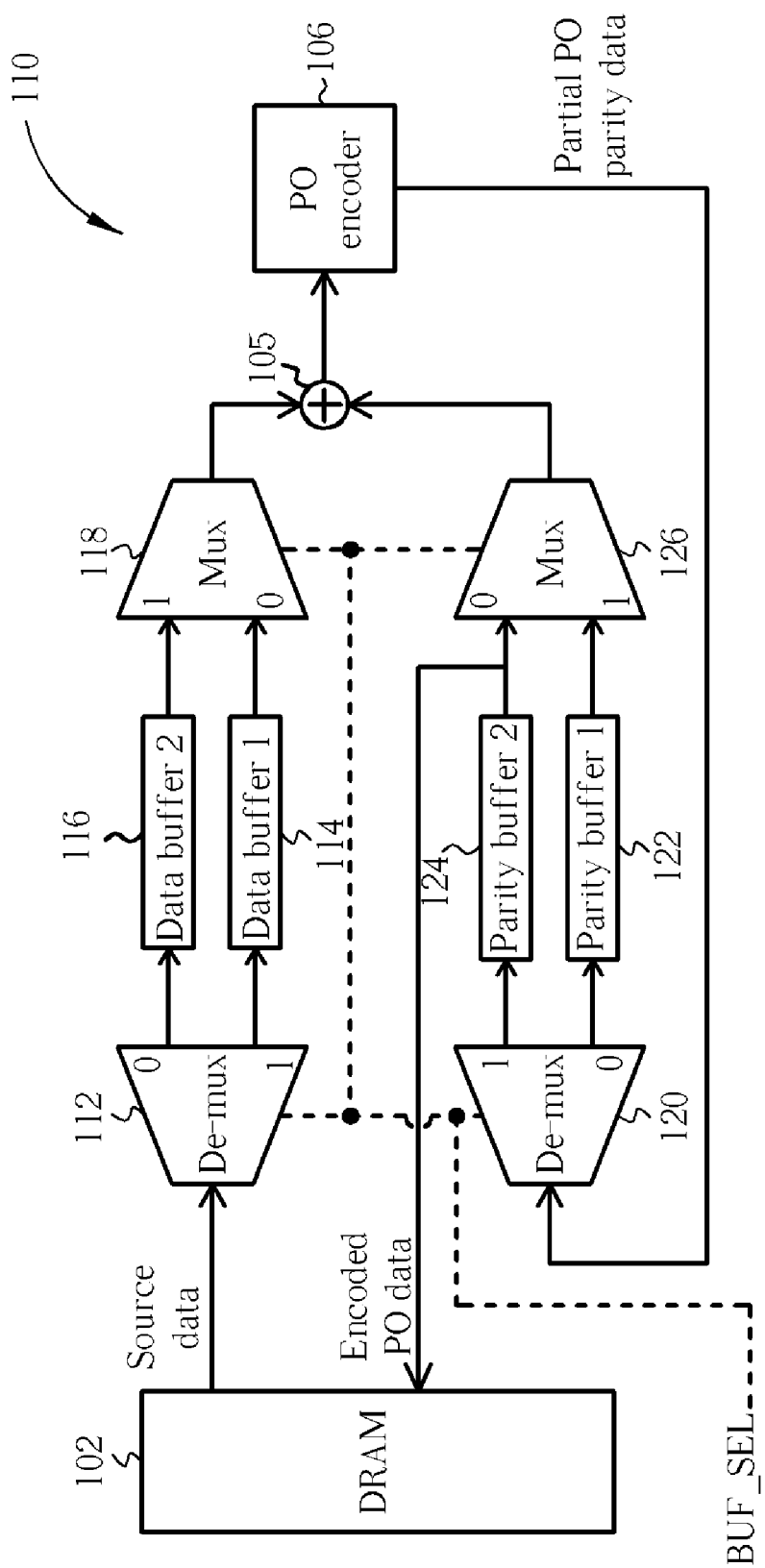
FIG. 17 illustrates a block diagram of an error correction code generator in accordance with another embodiment of the present invention.

FIG. 17 illustrates a block diagram of an error correction code generator 110 in accordance with another embodiment of the present invention. The error correction code generator 110 is a variation of the error correction code generator 100 shown in FIG. 16, and utilizes two data buffers 114, 116 and two parity buffers 122, 124 for allowing data to be written to the buffers and read from the buffers simultaneously, thereby further increasing the PO encoding processing speed. A first de-multiplexer 112 is used for directing source data from the DRAM 102 to either a first data buffer 114 or a second data buffer 116, in turns. A first multiplexer 118 reads the source data stored in the appropriate data buffer 114, 116 and feeds it to the summing circuit 105, where the source data is combined with partial PO parity data and then send to the PO encoder 106. A second de-multiplexer 120 sends the partial PO parity data to either a first parity buffer 122 or a second parity buffer 124 for storage. When encoding another group of source data, a second multiplexer 126 reads out partial PO parity data stored in one of the parity buffers 122, 124 and sends it to the summing circuit 105.

Like the error correction code generator 100 of FIG. 16, the error correction code generator 110 uses a recursive algorithm for calculating encoded PO parity data. Once the PO parity data has been fully encoded, the encoded PO parity data is output from the second parity buffer 124 to the DRAM 102. The first de-multiplexer 112 and the second de-multiplexer 120 as well as the first multiplexer 118 and the second multiplexer 126 are setup with opposite logic configurations. A buffer select signal BUF_SEL is used to activate one of the first de-multiplexer 112 and the second de-multiplexer 120 at a time and to activate one of the first multiplexer 118 and the second multiplexer 126. Because the recursive calculating of the encoded PO parity data can make use of smaller buffers, the error correction code generator 110 takes advantage of this fact to use four buffers instead of two. Each of the four buffers 114, 116, 122, 124 can store 16 words×16 rows of data. To make the speed of PO encoding as fast as possible, source data can now be written to the first data buffer 114 while source data is being read from the second data buffer 116, and vice versa.

Figure 18:
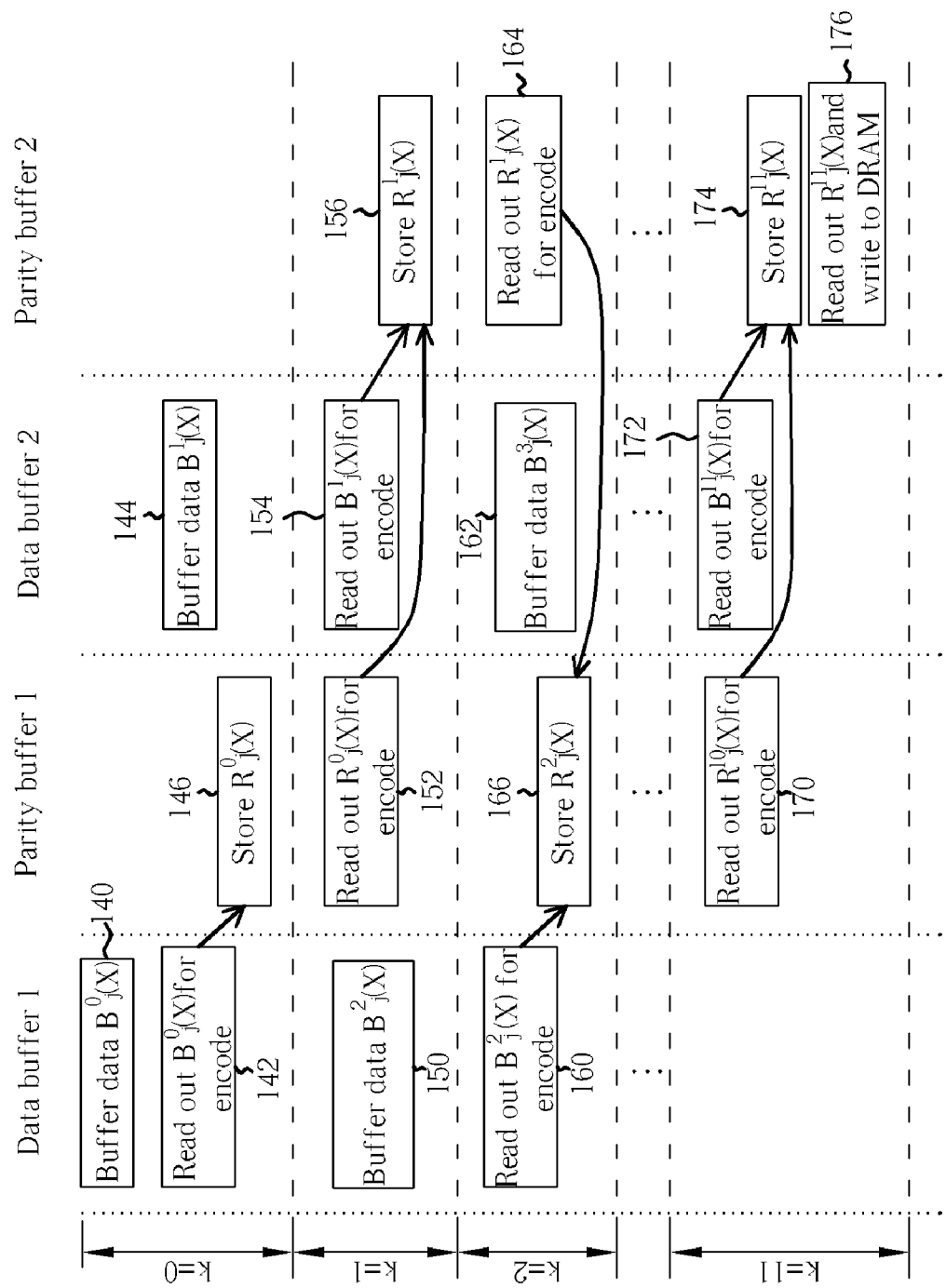
FIG. 18 is a timing diagram showing steps executed during the operation of the error correction code generator shown in FIG. 17.

FIG. 18 is a timing diagram showing steps executed during the operation of the error correction code generator 110 shown in FIG. 17. The timing diagram illustrates the 12 stages needed to fully encode one set of PO parity data, with the variable k indicating the stage number. In stage k=0, a first group of buffer data $B_j^0(x)$ is stored in the first data buffer 114 in step 140. Then the first group of buffer data $B_j^0(x)$ is read out from the first data buffer 114 in step 142 while a second group of buffer data $B_j^1(x)$ is stored in the second data buffer 116 in step 144. The first group of buffer data $B_j^0(x)$ is encoded by the PO encoder 106, and in step 146 is stored in the first parity buffer 122 as a first group of partial PO parity data $R^0_j(x)$.

In stage k=1, a third group of buffer data $B^2_j(x)$ is stored in the first data buffer 114 in stage 150. Simultaneously, the second group of buffer data $B^1_j(x)$ is read out from the second data buffer 116 for encoding in step 154 and the first group of partial PO parity data $R^0_j(x)$ is read out from the first parity buffer 122 for encoding in step 152. A second group of partial PO parity data $R^1_j(x)$ is produced by the PO encoder 106, and is stored in the second parity buffer 124 in step 156.

In stage k=2, a fourth group of buffer data $B^3_j(x)$ is stored in the second data buffer 116 in stage 162. Simultaneously, the third group of buffer data $B^2_j(x)$ is read out from the first data buffer 114 for encoding in step 160 and the second group of partial PO parity data $R^1_j(x)$ is read out from the second parity buffer 124 for encoding in step 164. A third group of partial PO parity data $R^2_j(x)$ is produced by the PO encoder 106, and is stored in the first parity buffer 122 in step 166.

Finally, in stage k=11, a twelfth group of buffer data $B^{11}_j(x)$ is read out from the second data buffer 116 for encoding in step 172 and an eleventh group of partial PO parity data $R^{10}_j(x)$ is read out from the first parity buffer 122 for encoding in step 170. A twelfth group of partial PO parity data $R^{11}_j(x)$ is produced by the PO encoder 106, and is stored in the second parity buffer 124 in step 174. Since the twelfth group of partial PO parity data $R^{11}_j(x)$ represents the encoded PO parity data, the PO parity data is read out of the second parity buffer 124 and stored in the DRAM 102 in step 176. The above process illustrates how one group of 16 words×16 rows of encoded PO parity data is calculated. Additional groups of PO parity data are also calculated in the same way.

Figure 19:
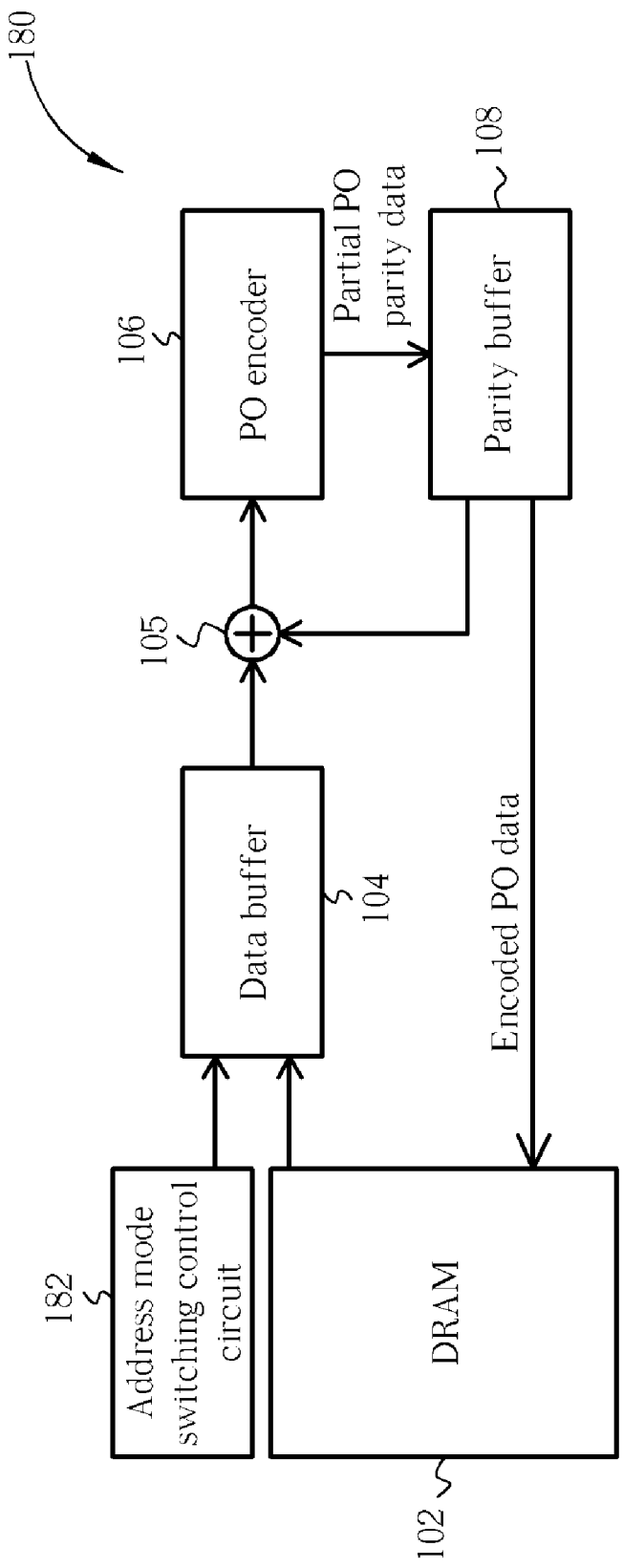
FIGS. 19-21 illustrate block diagrams of error correction code generators in accordance with some embodiments of the present invention.

FIG. 19 illustrates a block diagram of an error correction code generator 180 in accordance with another embodiment of the present invention. Differing from the error correction code generator 100 shown in FIG. 16, the error correction code generator 180 also contains an address mode switching circuit 182 for controlling the way that the source data is stored in and read from the data buffer 104. The error correction code generator 180 combines the ideas of the recursive calculation algorithm used in the error correction code generator 100 of FIG. 16 and the alternating row-by-row and column-by-column memory accessed used in the error correction code generator 40 of FIG. 4. The combination of both of these strategies allows the PO parity data to be encoded even more efficiently.

Figure 20:
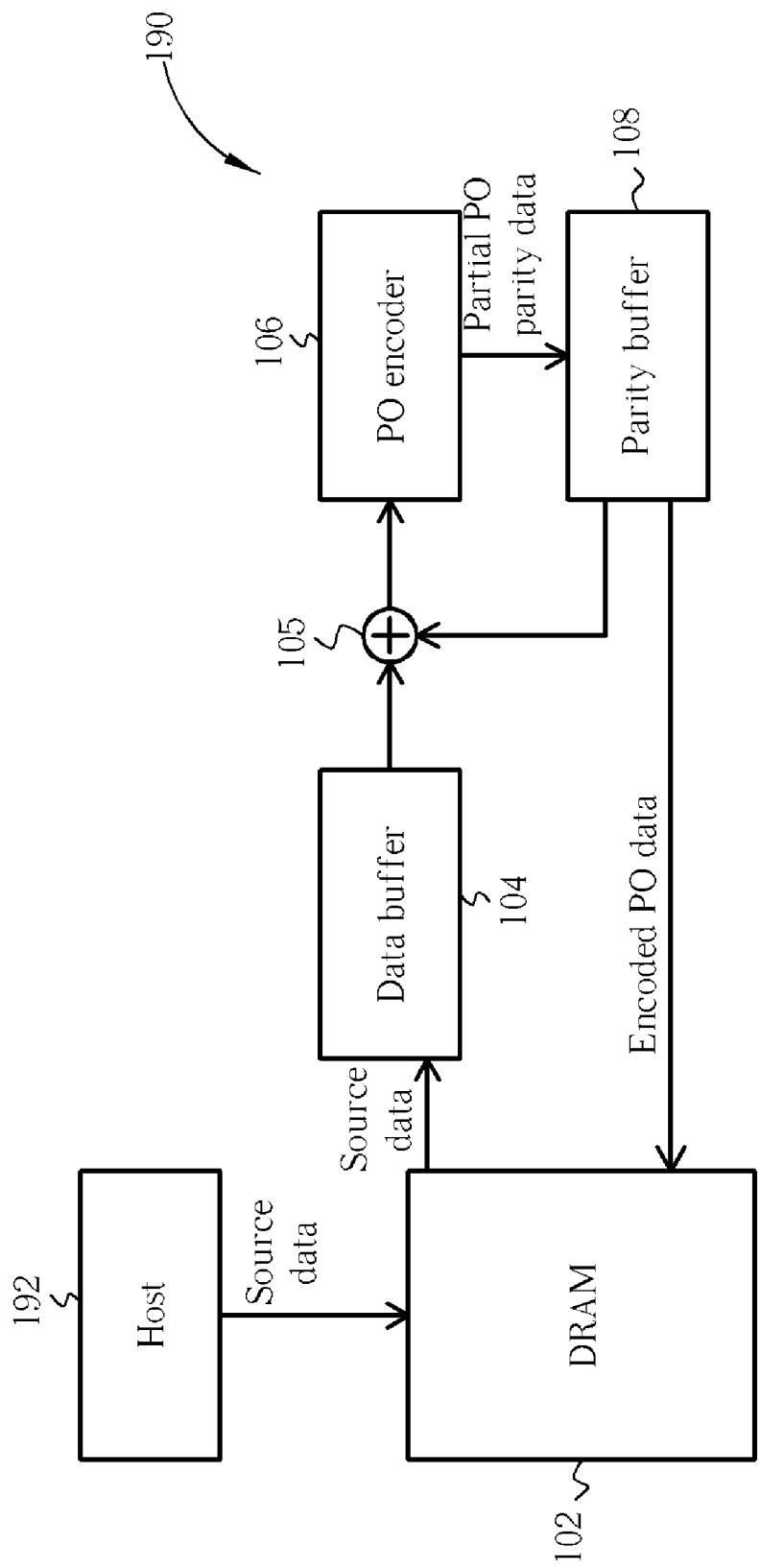

FIG. 20 is a block diagram of an error correction code generator 190 in accordance with another embodiment of the present invention. Differing from the error correction code generator 100 shown in FIG. 16, the error correction code generator 190 utilizes a host 192 to supply source data to the DRAM 102. The DRAM 102 stores the source data for the data buffer 104 to read for encoding the PO parity data.

Figure 21:
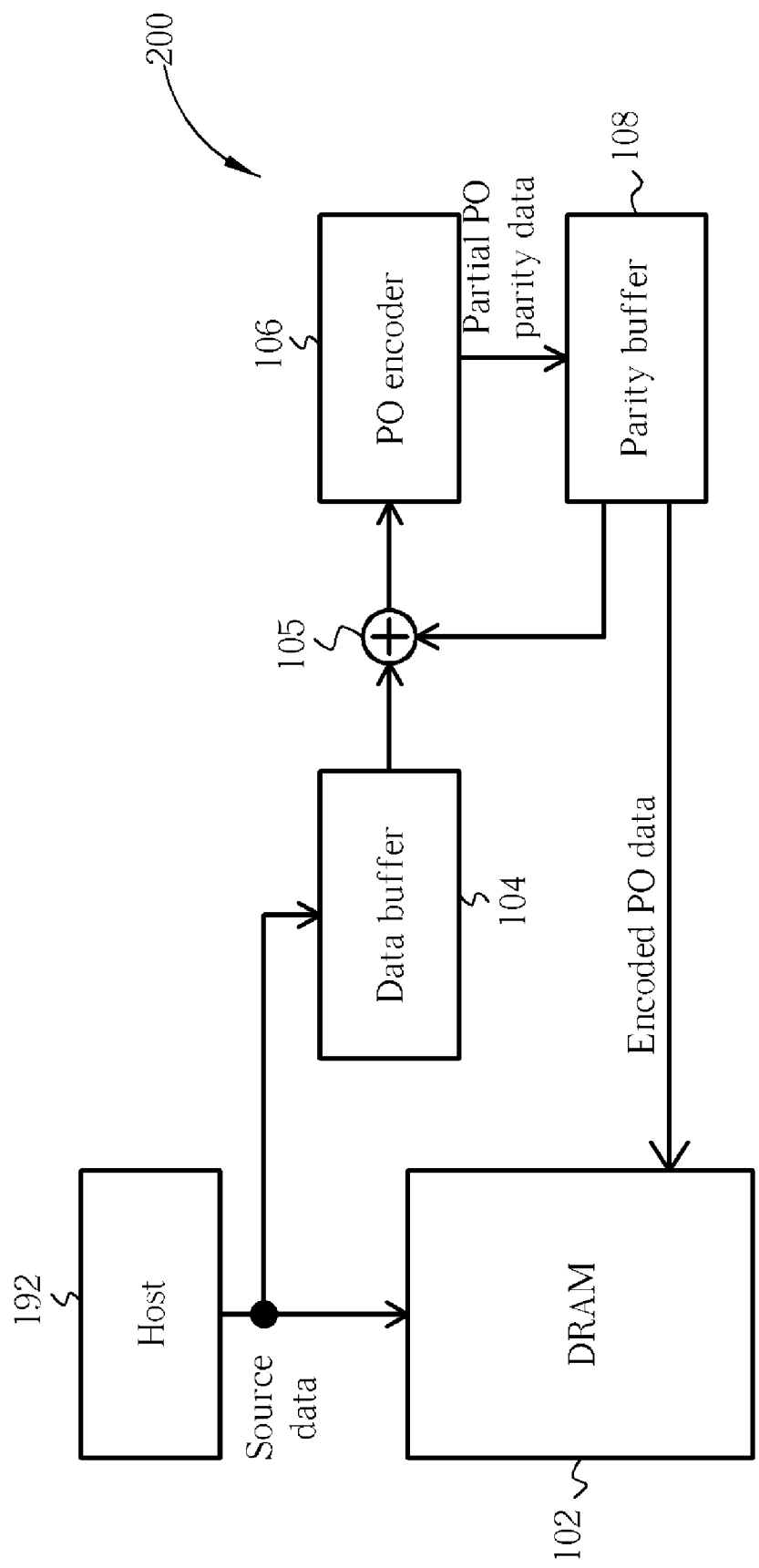

However, instead of the host 192 supplying the source data to the DRAM 102 and the DRAM 102 supplying the source data to the data buffer 104, the host 192 can also supply the source data to the data buffer 104 directly, as shown in the error correction code generator 200 of FIG. 21. A copy of the source data can also be stored in the DRAM 102 for use in encoding PI codes later. Since the encoding process performed by the PO encoder 106 is usually faster than the transmission speed of the host 192, the host 192 can supply the source data to the data buffer 104 directly without the problem of buffer overflow.

In summary, the present invention provides various circuits and methods for calculating error correction codes using a smaller memory buffer, by controlling the memory accesses to take advantage of the more efficient page-mode data access, or by simultaneously reading source data from a data buffer and writing source data to the data buffer.

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising " are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for encoding a data block to generate corresponding error correction codes, wherein the data block includes a plurality of rows and columns for generating error correction code (ECC) parity columns, the system comprising:
    a first buffer for sequentially storing a first section and a second section of the data block, wherein each of the first and second sections is composed of X data rows and Y data columns of the data block, where Y is an integer greater than or equal to 2 and X is an integer greater than or equal to 1;
    a second buffer for storing Y partial-parity columns; and
    an encoder for encoding the first section read from the first buffer to generate the partial-parity columns, storing the partial-parity columns in the second buffer, encoding the second section read from the first buffer and the partial-parity columns read from the second buffer to generate new partial-parity columns, storing the new partial-parity columns in the second buffer, and recursive encoding sections belonging to the same Y data columns to generate the ECC parity columns;
    wherein the ECC parity columns are stored in the first buffer for use in calculating ECC parity rows.

2. The system of claim 1, wherein both the first buffer and the second buffer comprise a static random access memory (SRAM).

3. The system of claim 1, wherein the ECC parity columns are parity outer (PO) codes of Reed-Solomon product codes (RSPCs) and the ECC parity rows are parity inner (PI) codes of RSPCs.

4. The system of claim 1, wherein the encoder accesses and encodes each un-encoded section of the Y data columns of the data block stored in the first buffer together with the partial-parity columns of previous encoded sections read from the second buffer to generate new partial-parity columns, and stores the new partial-parity columns into the second buffer for encoding the subsequent un-encoded section.

5. The system of claim 4, wherein the second buffer outputs the new partial-parity columns as the ECC parity columns corresponding to the Y data columns when the encoder encodes all sections of the Y data columns.

6. The system of claim 4, wherein the new partial-parity columns generated by the encoder updates and overwrites the partial-parity columns of previous encoded sections stored in the second buffer.

7. The system of claim 1, further comprising a summing circuit for combining output of the first buffer with the partial-parity columns output from the second buffer as input for the encoder.

8. The system of claim 1, further comprising an address mode switching circuit for controlling the first section to be stored in the first buffer according to a first accessing strategy, and controlling the second section to be stored in the first buffer according to a second accessing strategy, wherein the first and second accessing strategies are different from one another.

9. The system of claim 8, wherein successive sections of the data block are stored in the first buffer in an alternating manner by toggling the first and second accessing strategies.

10. The system of claim 8, wherein the address mode switching circuit controls the first section to be read from the first buffer by the encoder according to the second accessing strategy and controls the second section to be read from the first buffer by the encoder according to the first accessing strategy.

11. The system of claim 10, wherein the second section of the data block is stored in the first buffer while the first section of the data block is being read from the first buffer by the encoder.

12. The system of claim 1, further comprising a dynamic random access memory (DRAM) for storing the data block, wherein the first buffer accesses the data block from the DRAM.

13. The system of claim 12, wherein encoded ECC parity columns are read from the second buffer and stored in the DRAM.

14. The system of claim 1, further comprising:
a DRAM; and
a host writing the data block in a data row direction in the DRAM, wherein the first buffer reads sections of the data block from the DRAM.

15. The system of claim 1, further comprising:
a DRAM; and
a host simultaneously writing the data block in a data row direction in both the DRAM and the first buffer.

16. The system of claim 1, wherein the first buffer further comprises:
a first memory for storing the first section of the Y data columns of the data block; and
a second memory for storing the second section of the Y data columns of the data block; and
the system further comprises:
a control circuit for controlling access to the first and second memories such that the encoder reads the first section from the first memory while the second memory receives and stores the second section.

17. A method for encoding a data block to generate corresponding error correction codes, wherein the data block includes a plurality of rows and columns for generating error correction code (ECC) parity columns, the method comprising:
sequentially storing a first section and a second section of the data block in a first buffer, wherein each of the first and second sections is composed of X data rows and Y data columns of the data block, where Y is an integer greater than or equal to 2 and X is an integer greater than or equal to 1;
storing Y partial-parity columns in a second buffer;
encoding the first section read from the first buffer to generate the partial-parity columns;
storing the partial-parity columns in the second buffer;
encoding the second section read from the first buffer and the partial-parity columns read from the second buffer to generate new partial-parity columns;
storing the new partial-parity columns in the second buffer;
generating the ECC parity columns by recursive encoding sections belonging to the same Y data columns; and
calculating ECC parity rows according to the data of the data block and the ECC parity columns.

18. The method of claim 17, wherein both the first buffer and the second buffer comprise a static random access memory (SRAM).

19. The method of claim 17, wherein the ECC parity columns are parity outer (PO) codes of Reed-Solomon product codes (RSPCs) and the ECC parity rows are parity inner (PI) codes of RSPCs.

20. The method of claim 17, wherein each of the un-encoded sections of the Y data columns of the data block stored in the first buffer is accessed and encoded together with the partial-parity columns of previous encoded sections read from the second buffer to generate new partial-parity columns, and the new partial-parity columns are stored in the second buffer for encoding the subsequent un-encoded section.

21. The method of claim 20, wherein the second buffer outputs the new partial-parity columns as the ECC parity columns corresponding to the Y data columns when all sections of the Y data columns have been encoded.

22. The method of claim 20, wherein the new partial-parity columns is stored in the second buffer to update and overwrite the partial-parity columns of previous encoded sections stored in the second buffer.

23. The method of claim 17, further comprising controlling the first section to be stored in the first buffer according to a first accessing strategy, and controlling the second section to be stored in the first buffer according to a second accessing strategy, wherein the first and second accessing strategies are different from one another.

24. The method of claim 23, wherein successive sections of the data block are stored in the first buffer in an alternating manner by toggling the first and second accessing strategies.

25. The method of claim 23, wherein the first section is read from the first buffer for encoding according to the second accessing strategy and the second section is read from the first buffer for encoding according to the first accessing strategy.

26. The method of claim 25, wherein the second section of the data block is stored in the first buffer while the first section of the data block is being read from the first buffer for encoding.

27. The method of claim 17, further comprising storing the data block in a dynamic random access memory (DRAM), wherein the first buffer accesses the data block from the DRAM.

28. The method of claim 27, wherein encoded ECC parity columns are read from the second buffer and stored in the DRAM.

29. The method of claim 17, further comprising storing the data block read from a host in a data row direction in a DRAM, wherein the first buffer reads sections of the data block from the DRAM.

30. The method of claim 17, further comprising storing the data block read from a host in a data row direction in a DRAM and in the first buffer simultaneously.

31. The method of claim 17, further comprising:
storing the first section of the Y data columns of the data block in a first memory of the first buffer;
storing the second section of the Y data columns of the data block in a second memory of the first buffer; and
controlling access to the first and memories such that the first section is read from the first memory for encoding while the second memory receives and stores the second section.

32. A system for encoding a data block to generate corresponding error correction codes, wherein the data block includes a plurality of rows and columns for generating error correction code (ECC) parity columns, the system comprising:
a parity buffer for storing partial-parity columns; and
an encoder for encoding a first section of the data block to generate the partial-parity columns, storing the partial-parity columns in the parity buffer, encoding a second section of the data block and the partial-parity columns read from the parity buffer to generate new partial-parity columns, recursive encoding sections belonging to the same group of columns to generate the ECC parity columns, and generating ECC parity rows based on the data block and the ECC parity columns;
wherein each of the first and second sections is composed of X data rows and Y data columns of the data block, where Y is an integer greater than or equal to 2 and X is an integer greater than or equal to 1.

33. The system of claim 32, wherein the ECC parity columns are parity outer (PO) codes of Reed-Solomon product codes (RSPCs) and the ECC parity rows are parity inner (PI) codes of RSPCs.

34. A method for encoding a data block to generate corresponding error correction codes, wherein the data block includes a plurality of rows and columns for generating error correction code (ECC) parity columns, the method comprising:
encoding a first section of the data block to generate partial-parity columns;
storing the partial-parity columns in a parity buffer;
encoding a second section of the data block and the partial-parity columns read from the parity buffer to generate new partial-parity columns;
generating the ECC parity columns by recursive encoding sections in the same group of columns; and
generating ECC parity rows according to the data of the data block and the ECC parity columns,
wherein each of the first and second sections is composed of X data rows and Y data columns of the data block, where Y is an integer greater than or equal to 2 and X is an integer greater than or equal to 1.

35. The method of claim 34, wherein the ECC parity columns are parity outer (PO) codes of Reed-Solomon product codes (RSPCs) and the ECC parity rows are parity inner (PI) codes of RSPCs.

* * * * *